(12) United States Patent
Moon et al.

(10) Patent No.: US 12,149,274 B2
(45) Date of Patent: Nov. 19, 2024

(54) ELECTRONIC DEVICE INCLUDING HOUSING

(71) Applicant: Samsung Electronics Co., Ltd., Gyeonggi-do (KR)

(72) Inventors: Heecheul Moon, Gyeonggi-do (KR); Jina Mock, Gyeonggi-do (KR); Moohyun Baek, Gyeonggi-do (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 359 days.

(21) Appl. No.: 17/667,755

(22) Filed: Feb. 9, 2022

(65) Prior Publication Data

US 2022/0271787 A1  Aug. 25, 2022

Related U.S. Application Data

(63) Continuation of application No. PCT/KR2022/001235, filed on Jan. 24, 2022.

(30) Foreign Application Priority Data

Jan. 29, 2021 (KR) .................. 10-2021-0013275
Jul. 2, 2021 (KR) .................. 10-2021-0086876

(51) Int. Cl.
*H04B 1/3888* (2015.01)
*H01Q 1/24* (2006.01)
(Continued)

(52) U.S. Cl.
CPC ........... *H04B 1/3888* (2013.01); *H01Q 1/243* (2013.01); *H04M 1/0249* (2013.01);
(Continued)

(58) Field of Classification Search
CPC ......... H04B 1/3888; H04B 2001/3894; H04M 1/0249; H04M 1/0264; H04M 1/0266; H05K 5/0017; H01Q 1/243; H04N 23/57
(Continued)

(56) References Cited

U.S. PATENT DOCUMENTS 8,903,311 B1 * 12/2014 Maryanka ................. H01P 3/04
                                                                                455/345
10,219,057 B2    2/2019 Uce et al.
10,972,591 B2    4/2021 Im et al.
2013/0050032 A1 *  2/2013 Shiu ..................... H01Q 1/2258
                                                                                343/702
(Continued)

FOREIGN PATENT DOCUMENTS

KR      10-1390973 B1     5/2014
KR      10-1775004 B1     9/2017
(Continued)

OTHER PUBLICATIONS

Written Opinion dated May 4, 2022.
Extended European Search Report dated May 17, 2024.

*Primary Examiner* — Jean A Gelin
(74) *Attorney, Agent, or Firm* — Cha & Reiter, LLC

(57) ABSTRACT

An electronic device according to an embodiment of the disclosure may include a front plate, a rear plate, a side member surrounding space between the front plate and the rear plate, a support member located in the space and coupled to the side member, a display located between the front plate and the support member, a first adhesive member located between the front plate and the support member, and a second adhesive member located between the rear plate and the support member. The support member may include a first surface coupled to the side member, a second surface on which the display is disposed and which is separated from the first surface with the first adhesive member interposed therebetween, and a third surface located opposite to the second surface and separated from the first surface with the
(Continued)

second adhesive member interposed therebetween. Various other embodiments are possible.

21 Claims, 17 Drawing Sheets

(51) Int. Cl.
  *H04M 1/02* (2006.01)
  *H04N 23/57* (2023.01)
  *H05K 5/00* (2006.01)

(52) U.S. Cl.
  CPC ....... *H04M 1/0264* (2013.01); *H04M 1/0266* (2013.01); *H04N 23/57* (2023.01); *H05K 5/0017* (2013.01)

(58) Field of Classification Search
  USPC ...................................... 455/575.8
  See application file for complete search history.

(56) References Cited

U.S. PATENT DOCUMENTS

| | | |
|---|---|---|
| 2018/0033571 A1 | 2/2018 | Choi et al. |
| 2019/0027812 A1 | 1/2019 | Kim et al. |
| 2019/0081393 A1* | 3/2019 | Zhou ..................... H05K 5/0017 |
| 2019/0081653 A1* | 3/2019 | Song ..................... H04B 1/3888 |
| 2019/0104211 A1* | 4/2019 | Shin ..................... H04M 1/0266 |
| 2020/0186183 A1 | 6/2020 | Park et al. |
| 2020/0252492 A1 | 8/2020 | Choi et al. |
| 2020/0265212 A1 | 8/2020 | Jung et al. |
| 2020/0348725 A1 | 11/2020 | Kim et al. |
| 2020/0358890 A1 | 11/2020 | Im et al. |
| 2021/0204435 A1 | 7/2021 | Choi et al. |

FOREIGN PATENT DOCUMENTS

| | | |
|---|---|---|
| KR | 10-2019-0054384 A | 5/2019 |
| KR | 10-2020-0069091 A | 6/2020 |
| KR | 10-2020-0094950 A | 8/2020 |
| KR | 10-2020-0128172 A | 11/2020 |
| KR | 10-2020-0130020 A | 11/2020 |

* cited by examiner

ELECTRONIC DEVICE INCLUDING HOUSING

CROSS-REFERENCE TO RELATED APPLICATION(S)

This application is a continuation of International Application No. PCT/KR2022/001235, filed on Jan. 24, 2022, which claims priority to Korean Patent Application No. 10-2021-0013275, filed on Jan. 29, 2021 and Korean Patent Application No. 10-2021-0086876, filed on Jul. 2, 2021 in the Korean Intellectual Property Office, the disclosures of which are herein incorporated by reference.

TECHNICAL FIELD

One or more embodiments of the instant disclosure generally relate to an electronic device including a housing.

BACKGROUND ART

As electronic devices such as smartphones have become increasingly common, housings of these electronic devices are being implemented to be visually luxurious or appealing in order to differentiate particular smartphones from others in the market place. The housing may include a metal portion, and the metal portion may implement a luxurious design unique to the metal while also providing durability. As the range of usable applications is widened, the number of antennas included in an electronic device is increasing, and the metal portion of the housing may be used as an antenna radiator.

An electronic device may be waterproofed to prevent failure due to moisture or water or to ensure stability. The housing including a metal portion used as an antenna radiator need to provide ease of manufacture as well as being able to provide waterproofing.

The technical problems to be addressed by this disclosure are not limited to those described above, and other technical problems, which are not described above, may be understood by a person ordinarily skilled in the related art, to which this disclosure belongs.

SUMMARY

An electronic device according to an embodiment of the disclosure may include a front plate, a rear plate located opposite to the front plate, a side member surrounding at least a portion of an internal space between the front plate and the rear plate, a support member located in the internal space and coupled to the side member, a display located between the front plate and the support member, at least a portion of the display being visible through the front plate, a first adhesive member located between the front plate and the support member to be adjacent to a periphery of the front plate, and a second adhesive member located between the rear plate and the support member to be adjacent to a periphery of the rear plate. The support member may include a first surface coupled to the side member, a second surface on which the display is disposed and which is separated from the first surface with the first adhesive member interposed therebetween, and a third surface located opposite to the second surface and separated from the first surface with the second adhesive member interposed therebetween.

An electronic device according to an embodiment of the disclosure may include a front plate, a rear plate located opposite to the front plate, a side member surrounding at least a portion of an internal space between the front plate and the rear plate, a support member located in the internal space and coupled to the side member, a display located between the front plate and the support member, at least a portion of the display being visible through the front plate, a first adhesive member located between the front plate and the support member to be adjacent to a periphery of the front plate, and a second adhesive member located between the rear plate and the support member to be adjacent to a periphery of the rear plate. The support member may include a first surface coupled to the side member, a second surface on which the display is disposed and which is separated from the first surface with the first adhesive member interposed therebetween, and a third surface located opposite to the second surface and separated from the first surface with the second adhesive member interposed therebetween. The support member may include a portion extending between the front plate and the side member to define a portion of a side surface of the electronic device. The outer surface of the electronic device may include a first boundary portion between the front plate and the support member, a second boundary portion between the rear plate and the side member, and a third boundary portion between the side member and the support member. The internal space of the electronic device may include a first space between the front plate and the second surface, a second space between the rear plate and the third surface, and a third space separated from the first space and the second space and extending from the second boundary portion to the third boundary portion via a space between the first surface and the side member.

An electronic device including a housing according to certain embodiments of the disclosure is able to provide ease of manufacture as well as being able to provide waterproofing. The housing may include a metal portion used as an antenna radiator.

In addition, effects that can be obtained or predicted by certain embodiments may be directly or implicitly disclosed in the detailed description of the embodiments of the disclosure.

DETAILED DESCRIPTION

Certain embodiments of the disclosure provide an electronic device including a housing that provides ease of manufacture as well as being able to provide waterproofing.

Hereinafter, certain embodiments disclosed herein will be described with reference to the accompanying drawings.

Figure 1:
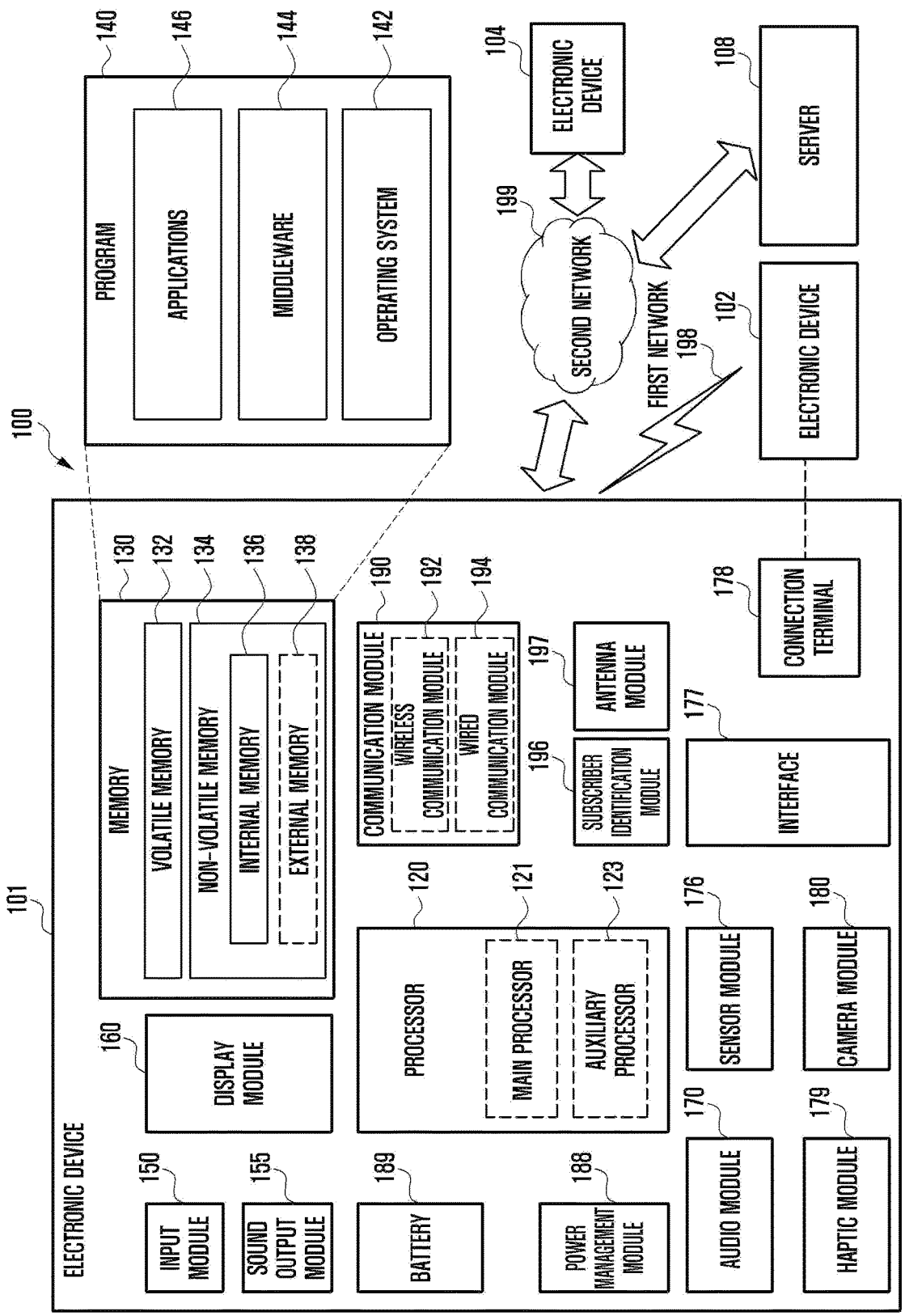
FIG. 1 is a block diagram of an electronic device in a network environment, in an embodiment.

FIG. 1 is a block diagram of an electronic device 101 in a network environment 100 according to an embodiment.

Referring to FIG. 1, the electronic device 101 in the network environment 100 may communicate with an electronic device 102 via a first network 198 (e.g., a short-range wireless communication network), or at least one of an electronic device 104 or a server 108 via a second network 199 (e.g., a long-range wireless communication network). The electronic device 101 may communicate with the electronic device 104 via the server 108. The electronic device 101 may include a processor 120, memory 130, an input module 150, a sound output module 155, a display module 160, an audio module 170, a sensor module 176, an interface 177, a connecting terminal 178, a haptic module 179, a camera module 180, a power management module 188, a battery 189, a communication module 190, a subscriber identification module (SIM) 196, and/or an antenna module 197. In some embodiments of the disclosure, at least one (e.g., the connection 178) of the components may be omitted from the electronic device 101, or one or more other components may be added in the electronic device 101. In some embodiments of the disclosure, some of the components may be implemented as single integrated circuitry. For example, the sensor module 176, the camera module 180, or the antenna module 197 may be implemented as embedded in single component (e.g., the display module 160).

The processor 120 may execute, for example, software (e.g., a program 140) to control at least one other component (e.g., a hardware or software component) of the electronic device 101 coupled with the processor 120, and may perform various data processing or computation. As at least part of the data processing or computation, the processor 120 may load a command or data received from another component (e.g., the sensor module 176 or the communication module 190) in volatile memory 132, process the command or the data stored in the volatile memory 132, and store resulting data in non-volatile memory 134. The processor 120 may include a main processor 121 (e.g., a central processing unit (CPU) or an application processor (AP)), or an auxiliary processor 123 (e.g., a graphics processing unit (GPU), a neural processing unit (NPU), an image signal processor (ISP), a sensor hub processor, or a communication processor (CP)) that is operable independently from, or in conjunction with, the main processor 121. Additionally or alternatively, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display module 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). The auxiliary processor 123 (e.g., an ISP or a CP) may be implemented as part of another component (e.g., the camera module 180 or the communication module 190) functionally related to the auxiliary processor 123. According to an embodiment of the disclosure, the auxiliary processor 123 (e.g., a neural network processing device) may include a hardware structure specified for processing an artificial intelligence model. The artificial intelligence model may be created through machine learning. Such learning may be performed, for example, in the electronic device 101 itself on which the artificial intelligence model is performed, or may be performed through a separate server (e.g., the server 108). The learning algorithms may include, for example, supervised learning, unsupervised learning, semi-supervised learning, or reinforcement learning, but is not limited thereto. The artificial intelligence model may include a plurality of artificial neural network layers. The artificial neural network may be any of a deep neural network (DNN), a convolutional neural network (CNN), a recurrent neural network (RNN), a restricted Boltzmann machine (RBM), a deep belief network (DBN), a bidirectional recurrent DNN (BRDNN), a deep Q-network, or a combination of two or more of the above-mentioned networks, but is not limited the above-mentioned examples. In addition to the hardware structure, the artificial intelligence model may additionally or alternatively include a software structure.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 and/or the non-volatile memory 134.

The program 140 may be stored in the memory 130 as software, and may include, for example, an operating system (OS) 142, middleware 144, and/or an application 146.

The input module 150 may receive a command or data to be used by another component (e.g., the processor 120) of the electronic device 101, from the outside (e.g., a user) of the electronic device 101. The input module 150 may include, for example, a microphone, a mouse, a keyboard, a key (e.g., a button), or a digital pen (e.g., a stylus pen).

The sound output module 155 may output sound signals to the outside of the electronic device 101. The sound output module 155 may include, for example, a speaker or a receiver. The speaker may be used for general purposes, such as playing multimedia or playing record, and the receiver may be used for incoming calls. The receiver may be implemented as separate from, or as part of the speaker.

The display module 160 may visually provide information to the outside (e.g., a user) of the electronic device 101. The display module 160 may include, for example, a display, a hologram device, or a projector and control circuitry to control a corresponding one of the display, hologram device, and projector. The display module 160 may include touch circuitry (e.g., a touch sensor) adapted to detect a touch, or sensor circuitry (e.g., a pressure sensor) adapted to measure the intensity of force incurred by the touch.

The audio module 170 may convert a sound into an electrical signal and vice versa. The audio module 170 may obtain the sound via the input module 150, or output the sound via the sound output module 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. The sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. The interface 177 may include, for example, a high-definition multimedia interface (HDMI), a universal serial bus (USB) interface, a secure digital (SD) card interface, and/or an audio interface.

The connecting terminal 178 may include a connector via which the electronic device 101 may be physically connected with the external electronic device (e.g., the electronic device 102). The connecting terminal 178 may include, for example, an HDMI connector, a USB connector, an SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. The haptic module 179 may include, for example, a motor, a piezoelectric element, or an electric stimulator.

The camera module 180 may capture a still image or moving images. The camera module 180 may include one or more lenses, ISPs, image signal processors, or flashes.

The power management module 188 may manage power supplied to or consumed by the electronic device 101. The power management module 188 may be implemented as at least part of, for example, a power management integrated circuit (PMIC).

The battery 189 may supply power to at least one component of the electronic device 101. The battery 189 may include, for example, a primary cell which is not rechargeable, a secondary cell which is rechargeable, and/or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more CPs that are operable independently from the processor 120 (e.g., the AP) and supports a direct (e.g., wired) communication or a wireless communication. The communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as BLUETOOTH, wireless-fidelity (Wi-Fi) direct, or IR data association (IrDA)) or the second network 199 (e.g., a long-range communication network, such as a legacy cellular network, a $5^{th}$ generation (5G) network, a next-generation communication network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the SIM 196.

The wireless communication module 192 may support a 5G network, after a $4^{th}$ generation (4G) network, and next-generation communication technology, e.g., new radio (NR) access technology. The NR access technology may support high-speed transmission of high-capacity data (i.e., enhanced mobile broadband (eMBB)), minimization of terminal power and connection of multiple terminals (massive machine type communications (mMTC)), or high reliability and low latency (ultra-reliable and low-latency communications (URLLC)). The wireless communication module 192 may support a high-frequency band (e.g., a mmWave band) to achieve, for example, a high data transmission rate. The wireless communication module 192 may support various technologies for securing performance in a high-frequency band, such as beamforming, massive multiple-input and multiple-output (MIMO), full-dimensional MIMO (FD-MIMO), array antenna, analog beam-forming, or large-scale antenna. The wireless communication module 192 may support various requirements specified in the electronic device 101, an external electronic device (e.g., the electronic device 104), or a network system (e.g., the second network 199). According to an embodiment of the disclosure, the wireless communication module 192 may support a peak data rate for implementing eMBB (e.g., 20 Gbps or more), loss coverage for implementing mMTC (e.g., 164 dB or less), or U-plane latency for realizing URLLC (e.g., 0.5 ms or less for each of downlink (DL) and uplink (UL) or 1ms or less for round trip).

The antenna module 197 may transmit or receive a signal or power to or from the outside (e.g., the external electronic device) of the electronic device 101. The antenna module 197 may include an antenna including a radiating element including a conductive material or a conductive pattern formed in or on a substrate (e.g., a printed circuit board (PCB)). The antenna module 197 may include a plurality of antennas (e.g., an antenna array). In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. Another component (e.g., a radio frequency integrated circuit (RFIC)) other than the radiating element may be additionally formed as part of the antenna module 197.

According to certain embodiments of the disclosure, the antenna module 197 may form a mmWave antenna module. According to an embodiment of the disclosure, the mmWave antenna module may include a PCB, an RFIC that is disposed on or adjacent to a first surface (e.g., the bottom surface) of the PCB and is capable of supporting a predetermined high-frequency band (e.g., a mmWave band), and a plurality of antennas (e.g., array antennas) that is disposed on or adjacent to a second surface (e.g., the top surface or the side surface) of the PCB and is capable of transmitting or receiving a signal of the predetermined high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

Commands or data may be transmitted or received between the electronic device 101 and the external electronic device 104 via the server 108 coupled with the second network 199. Each of the electronic devices 102 or 104 may be a device of a same type as, or a different type, from the electronic device 101. All or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, mobile edge computing (MEC), or client-server computing technology may be used, for example. The electronic device 101 may provide an ultra-low delay service using, for example, distributed computing or MEC. In another embodiment of the disclosure, the external electronic device 104 may include an internet of things (IoT) device. The server 108 may be an intelligent server using machine learning and/or neural networks. According to an embodiment of the disclosure, the external electronic device 104 or the server 108 may be included in the second network 199. The electronic device 101 may be applied to an intelligent service (e.g., smart home, smart city, smart car, or healthcare) based on 5G communication technology or IoT-related technology.

An electronic device according to an embodiment of the disclosure may be one of various types of electronic devices. The electronic devices may include a portable communication device (e.g., a smartphone), a computer device, a portable multimedia device, a portable medical device, a camera, a wearable device, or a home appliance. However, the electronic device is not limited to any of those described above.

Certain embodiments of the disclosure and the terms used herein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). If an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

The term "module" may include a unit implemented in hardware, software, or firmware, and may interchangeably be used with other terms, for example, "logic," "logic block," "part," or "circuitry." A module may be a single integral component, or a minimum unit or part thereof, adapted to perform one or more functions. For example, according to an embodiment of the disclosure, the module may be implemented in a form of an application-specific integrated circuit (ASIC).

Certain embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a compiler or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

A method according to an embodiment of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PLAY-STORE™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

Each component (e.g., a module or a program) of the above-described components may include a single entity or multiple entities. One or more of the above-described components may be omitted, or one or more other components may be added. Alternatively or additionally, a plurality of components (e.g., modules or programs) may be integrated into a single component. In such a case, the integrated component may perform one or more functions of each of the plurality of components in the same or similar manner as they are performed by a corresponding one of the plurality of components before the integration. Operations performed by the module, the program, or another component may be carried out sequentially, in parallel, repeatedly, or heuristically, or one or more of the operations may be executed in a different order or omitted, or one or more other operations may be added.

Figure 2:
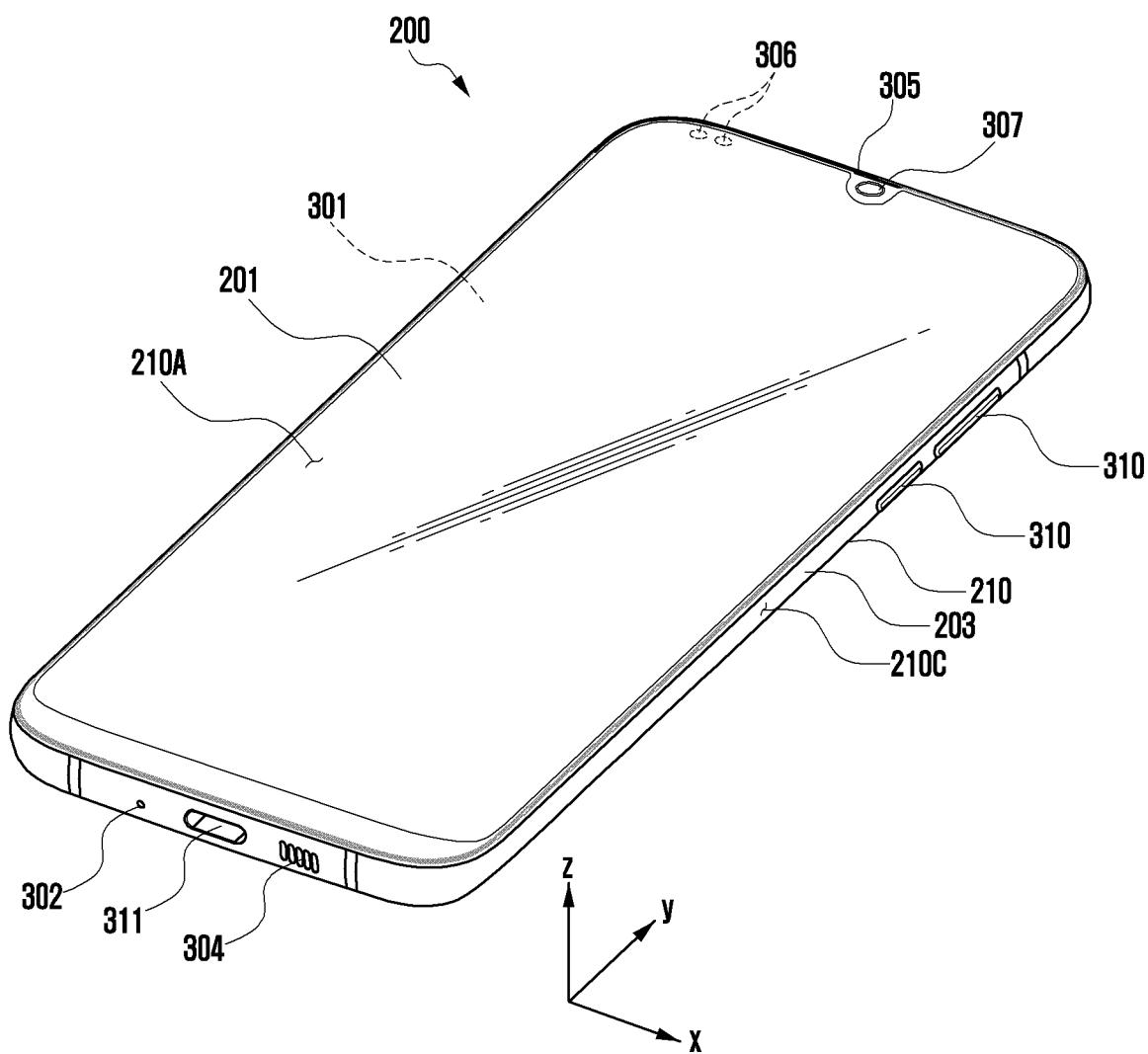
FIG. 2 is a front perspective view of an electronic device according to an embodiment.
Figure 3:
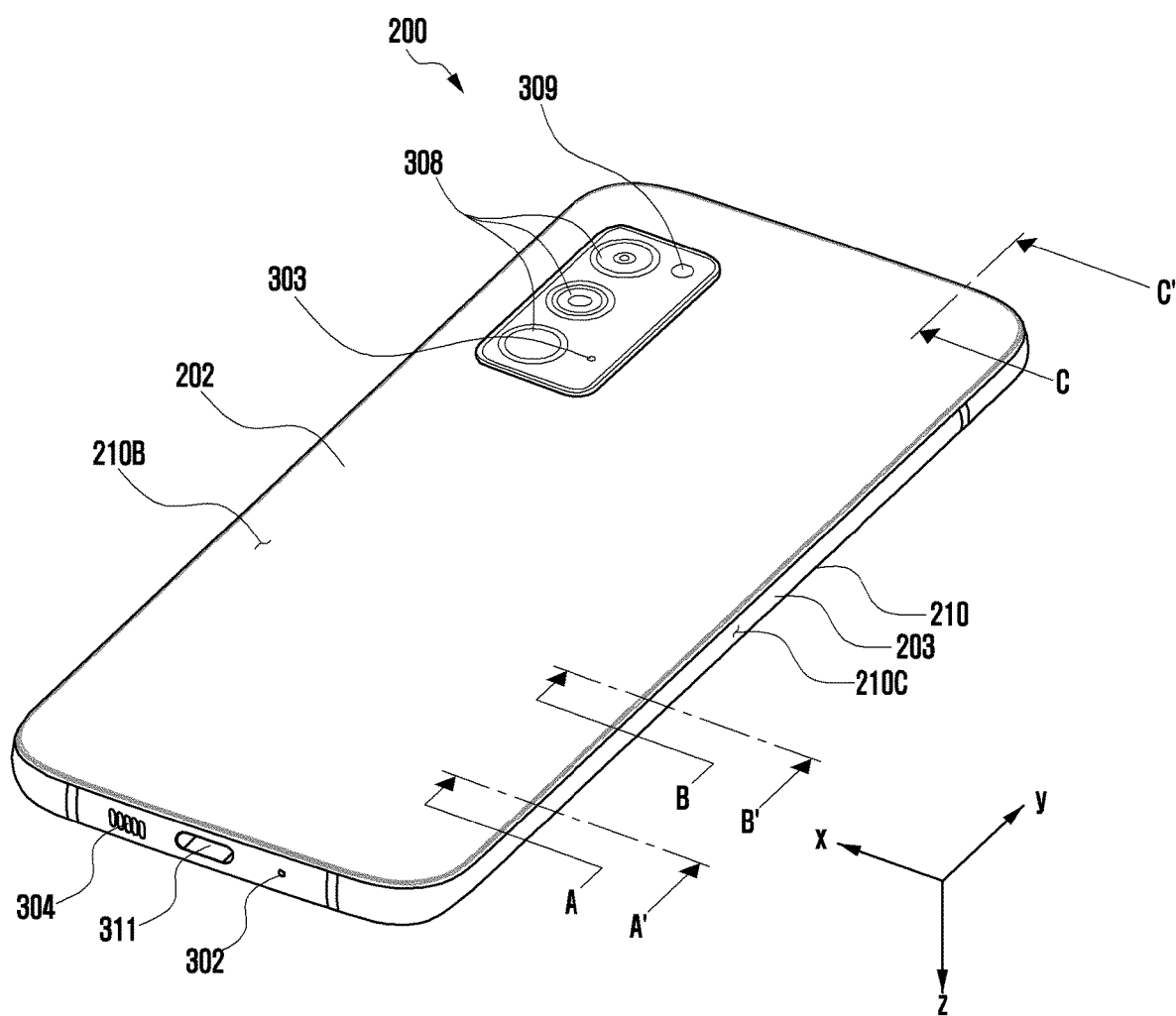
FIG. 3 is a rear perspective view of the electronic device of FIG. 2 according to an embodiment.

FIG. 2 is a front perspective view of an electronic device 200 according to an embodiment. FIG. 3 is a rear perspective view of the electronic device 200 of FIG. 2 according to an embodiment.

Referring to FIGS. 2 and 3, in an embodiment, the electronic device 200 (e.g., the electronic device 101 in FIG. 1) may include a housing 210 including a front surface 210A, a rear surface 210B, and a side surface 210C surrounding the space between the front surface 210A and the rear surface 210B. In some embodiments, the housing 210 may refer to a structure that includes at least part of the front surface 210A, the rear surface 210B, and the side surface 210C. The front surface 210A may be provided by a front plate (or a first plate) 201 (e.g., glass plate including various coating layers, or a polymer plate) that is at least partially transparent. The rear surface 210B may be provided by a substantially opaque rear plate (or a second plate) 202. The rear plate 202 may be made of, for example, coated or colored glass, ceramic, polymer, or metal (e.g., aluminum, stainless steel (STS), or magnesium), or a combination of two or more of these materials. The side surface 210C may be provided by a side member (or a side bezel structure) 203 coupled to the front plate 201 and the rear plate 202. The side member 203 may include metal and/or polymer.

According to an embodiment, the electronic device 200 may include at least one of a display 301, a first audio module 302, a second audio module 303, a third audio module 304, a fourth audio module 305, a sensor module 306, a first camera module 307, a plurality of second camera modules 308, a light-emitting module 309, an input module 310, and a connection terminal module 311. In some embodiments, at least one of the above-mentioned components may be omitted from the electronic device 200 or other components may be additionally included in the electronic device 200.

A display area (e.g., a screen display area or an active area) of the display 301 may be visually exposed through, for example, the front plate 201. In an embodiment, the electronic device 200 may be implemented to maximize the display area visible through the front plate 201 (e.g., a large screen or a full screen). For example, the display 301 may be implemented to have a contour shape substantially the same as the contour shape of the front plate 201. As another example, the distance between the contours of the display 301 and the contours of the front plate 201 may be substantially constant. In an embodiment, the display 301 may include a touch detecting circuit. In some embodiments, the display 301 may include a pressure sensor capable of measuring the intensity (pressure) of a touch. In some embodiments, the display 301 may be coupled to or located adjacent to a digitizer (e.g., an electromagnetic induction panel) that detects a magnetic field-type electronic pen (e.g., a stylus pen).

The first audio module 302 may include, for example, a first microphone located inside the electronic device 200 and a first microphone hole provided in the side surface 210C to correspond to the first microphone. The second audio module 303 may include, for example, a second microphone located inside the electronic device 200 and a second microphone hole provided in the rear surface 210B to correspond to the second microphone. The positions or number of audio modules in terms of the microphones are not limited to the illustrated example and may vary. In some embodiments, the electronic device 200 may include a plurality of microphones used to detect the direction of sound.

The third audio module 304 may include, for example, a first speaker located inside the electronic device 200 and a first speaker hole provided in the side surface 210C to correspond to the first speaker. The fourth audio module 305 may include, for example, a second speaker located inside the electronic device 200 and a second speaker hole provided in the front surface 210A to correspond to the second speaker. In an embodiment, the second speaker may include a receiver for phone calls, and the second speaker hole may be referred to as a receiver hole. The positions or number of third audio modules 304 or fourth audio modules 305 is not limited to the illustrated example and may vary. In some embodiments, the microphone hole and the speaker hole may be implemented as one single hole. In some embodiments, the third audio module 304 or the fourth audio module 305 may include a piezo speaker for which the speaker hole is omitted.

The sensor module 306 may generate electrical signals or data values corresponding to, for example, the internal operating states or the external environmental states of the electronic device 200. In an embodiment, the sensor module 306 may include an optical sensor located inside the electronic device 200 to correspond to the front surface 210A. The optical sensor may include, for example, a proximity sensor or an illuminance sensor. The optical sensor may be aligned with an opening provided in the display 301. External light may be introduced into the optical sensor through the front plate 201 and the opening in the display 301. In some embodiments, the optical sensor may be disposed at the lower end of the display 301, and the optical sensor may its functions without having its position be visually differentiated (or exposed). For example, the optical sensor may be located on the rear surface of the display 301, or below or beneath the display 301. In some embodiments, the optical sensor may be located to be aligned with a recess provided in the rear surface of the display 301. The optical sensor may be disposed overlapping at least a portion of the screen to perform its detecting function without being visually exposed. In this case, a partial area of the display 301 that at least partially overlaps the optical sensor may include a pixel structure and/or a wiring structure different from those of other areas. For example, the partial area of the flexible display 301 that at least partially overlaps the optical sensor may have a pixel density different from that of other areas. In some embodiments, a plurality of pixels may not be disposed in the partial area of the display 301 that at least partially overlaps the optical sensor. In some embodiments, the electronic device 200 may include a biometric sensor (e.g., a fingerprint sensor) positioned below the display 301. The biometric sensor may be implemented as an optical sensor, an electrostatic sensor, or an ultrasonic sensor, and the position or number thereof may vary. The electronic device 200 may further include at least one of various other sensor modules, such as a gesture sensor, a gyro sensor, an atmospheric pressure sensor, a magnetic sensor, an acceleration sensor, a grip sensor, a color sensor, an infrared (IR) sensor, a temperature sensor, or a humidity sensor.

The first camera module 307 (e.g., a front camera module) may be located inside the electronic device 200 to correspond to, for example, the front surface 210A. The plurality of second camera modules 308 (e.g., rear camera modules) may be located inside the electronic device 200 to correspond to, for example the rear surface 210B. The first camera module 307 and/or the plurality of second camera modules 308 may include one or more lenses, image sensor, and/or image signal processor. The position or number of first camera module or second camera modules is not limited to the illustrated example and may vary.

According to an embodiment, the display 301 may include an opening aligned with the first camera module 307. External light may reach the first camera module 307 through the front plate 201 and the opening in the display 301. In an embodiment, the opening in the display 301 may be provided in the form of a notch. In some embodiments, the opening in the display 301 may be provided in the form of a hole. According to some embodiments, the first camera module 307 may be disposed at the lower end of the display 301, and may perform its functions (e.g., image capture) in the state in which the position of the first camera module 307 is not visually distinguished (or exposed). For example, the first camera module 307 may be located on the rear surface of the display 301 or below or beneath the display 301 and may include a camera hidden behind the display (e.g., under display camera (UDC)). In some embodiments, the first camera module 307 may be located to be aligned with the recess provided in the rear surface of the display 301. The first camera module 307 may be disposed to overlap at least a portion of the screen to acquire an image of an external subject without being visually exposed to the outside. In this case, a partial area of the display 301 that at least partially overlaps the first camera module 307 may include a pixel structure and/or a wiring structure different from those of other areas. For example, the partial area of the display 301 that at least partially overlaps the first camera module 307 may have a pixel density different from that of other areas. The pixel structure and/or the wiring structure provided in the partial area of the display 301 that at least partially overlaps the first camera module 307 may reduce light loss between the outside and the first camera module 307. In some embodiments, pixels may not be disposed in the partial area of the display 301 that at least partially overlaps the first camera module 307. In some embodiments, the electronic device 200 may further include a light-emitting module (e.g., a light source) located inside the electronic device 200 to correspond to the front surface 210A. The light-emitting module may provide, for example, the state information of the electronic device 200 in an optical form. In some embodiments, the light-emitting module may provide a light source that is interlocked with the operation of the first camera module 307. The light-emitting module may include, for example, an LED, an IR LED, or a xenon lamp.

According to an embodiment, the plurality of second camera modules 308 may have different properties (e.g., angles of view) or functions, and may include, for example, a dual camera or a triple camera. The plurality of second camera modules 308 may include a plurality of camera modules including lenses having different angles of view, and the electronic device 200 may control the camera modules to change the angles of view of the camera modules operated therein based on a user's selection. The plurality of second camera modules 308 may include at least one of a wide-angle camera, a telephoto camera, a color camera, a monochrome camera, or an infrared (IR) camera (e.g., a time of flight (TOF) camera or a structured light camera). In some embodiments, the IR camera may be operated as at least part of a sensor module. The light-emitting module 309 (e.g., a flash) may include a light source for the plurality of second camera modules 308. The light-emitting module 309 may include, for example, an LED or a xenon lamp.

The input module 310 may include, for example, one or more key input devices. The one or more key input devices may be located, for example, in an opening provided in the side surface 210C. In some embodiments, the electronic device 200 may not include some or all of the key input devices, and the not included key input devices may be implemented as soft keys using the display 301. The location or number of input modules 310 may vary, and in some embodiments, input modules 310 may include at least one sensor module.

A connection terminal module (e.g., a connector module or an interface terminal module) 311 may include, for example, a connector (or an interface terminal) located inside the electronic device 200, and a connector hole provided in the side surface 210C to correspond to the connector. The electronic device 200 may transmit and/or receive power and/or data to an external electronic device electrically connected to the connector. In an embodiment, the connector may include a universal serial bus (USB) connector or a high-definition multimedia interface (HDMI) connector. In some embodiments, the electronic device 200 may further include another connection terminal module including an audio connector (e.g., a headphone connector or an ear set connector). The position or number of connection terminal modules is not limited to the illustrated example and may vary.

Figure 4:
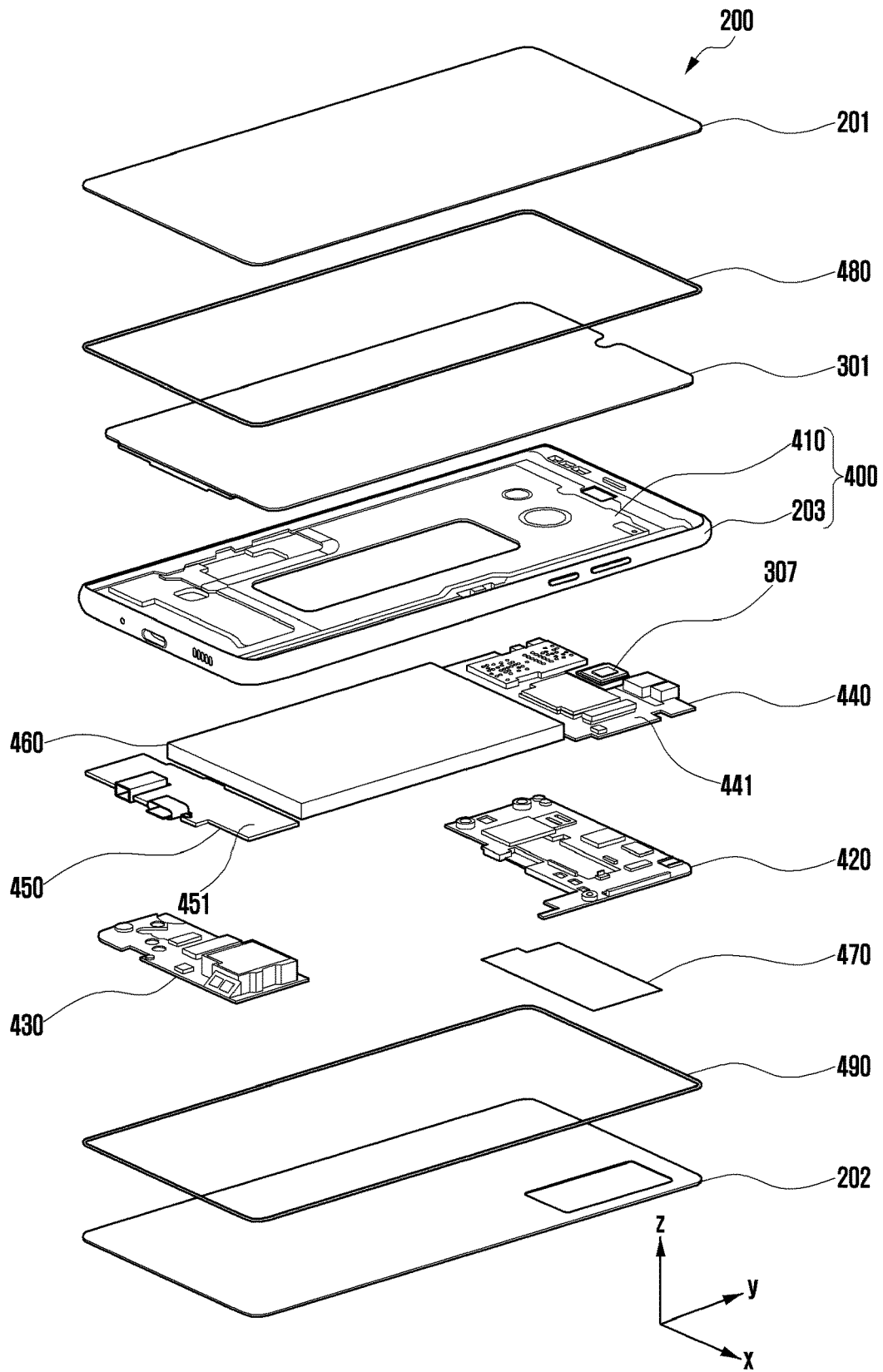
FIG. 4 is an exploded view of the electronic device of FIG. 2 according to an embodiment.

FIG. 4 is an exploded view of the electronic device 200 of FIG. 2 according to an embodiment.

Referring to FIG. 4, in an embodiment, the electronic device 200 may include a front plate 201, a rear plate 202, a side member 203, a first support member 410, and a second support member 420, a third support member 430, a display 301, a first board assembly 440, a second board assembly 450, a battery 460, an antenna structure 470, a first adhesive member 480, and/or a second adhesive member 490. In some embodiments, in the electronic device 200, at least one of the above-mentioned components (e.g., the second support member 420 or the third support member 430) may be omitted, or other components may be additionally included.

The first support member 410 may be disposed, for example, inside the electronic device 200 and connected to the side structure 203, or may be integrated with the side structure 203. The first support member 410 may be made of, for example, a metal material and/or a non-metal material (e.g., polymer). In an embodiment, the conductive portion included in the first support member 410 may serve as an electromagnetic shield for the display 301, the first board assembly 440, and/or the second board assembly 450. The first support member 410 and the side member 203 may be collectively referred to as front case 400. The first support member 410 is a portion of the front case 400 in which components such as the display 301, the first board assembly 440, the second board assembly 450, or the battery 460 are disposed, and may contribute to the durability or rigidity (e.g., torsional rigidity) of the electronic device 200. In some embodiments, the first support member 410 may be referred to as a bracket, a mounting plate, or a support structure.

The display 301 may be located, for example, between the first support member 410 and the front plate 201, and may be disposed on one surface of the first support member 410. The first board assembly 440 and the second board assembly 450 may be located, for example, between the first support member 410 and the rear plate 202, and may be disposed on the other surface of the first support member 410. The battery 460 may be located, for example, between the first support member 410 and the rear plate 202, and may be disposed on the first support member 410.

According to an embodiment, the first board assembly 440 may include a first printed circuit board 441 (e.g., printed circuit board (PCB) or printed circuit board assembly (PBA)). The first board assembly 440 may include various electronic components electrically connected to the first printed circuit board 441. The electronic components may be disposed on the first printed circuit board 441 or may be electrically connected to the first printed circuit board 441 via an electrical path such as a cable or a flexible printed circuit board (FPCB). Referring to FIGS. 2 and 3, the electronic components may include, for example, a second microphone included in the second audio module 303, a second speaker included in the fourth audio module 305, a sensor module 306, a first camera module 307, a plurality of second camera modules 308, a light-emitting module 309, or an input module 310.

According to an embodiment, the second board assembly 450 may be located to be spaced apart from the first board assembly 440 with the battery 460 interposed therebetween when viewed from above the front plate 201 (e.g., when viewed in the −z-axis direction). The second board assembly 450 may include a second printed circuit board 451 electrically connected to the first printed circuit board 441 of the first board assembly 440. The second board assembly 450 may include various electronic components electrically connected to the second printed circuit board 451. The electronic components may be disposed on the second printed circuit board 451 or may be electrically connected to the second printed circuit board 451 via an electrical path such as a cable or an FPCB. Referring to FIGS. 2 and 3, the electronic components may include, for example, a first microphone included in the first audio module 302, a first speaker included in the third audio module 304, or a connector included in the connection terminal module 311.

According to some embodiments, the first board assembly 440 or the second board assembly 450 may include a primary PCB (or a main PCB or a master PCB), a secondary PCB (or a slave PCB) disposed to partially overlap the primary PCB, and may further include an interposer substrate located between the primary PCB and the secondary PCB.

The battery 460 is a device for supplying power to at least one component of the electronic device 200, and may include, for example, a non-rechargeable primary battery, a rechargeable secondary battery, or a fuel cell. The battery 460 may be integrally disposed inside the electronic device 200, or may be detachably disposed on the electronic device 200.

According to an embodiment, the second support member 420 may be located between the first support member 410 and the rear plate 202, and may be coupled to the first support member 410 using a fastening element such as a screw (or a bolt). At least a portion of the first board assembly 440 may be located between the first support member 410 and the second support member 420, and the second support member 420 may cover and protect the first board assembly 440. The third support member 430 may be located at least partially spaced apart from the second support member 420 with the battery 460 interposed therebetween when viewed from above the rear plate 202 (e.g., when viewed in the +z-axis direction). The third support member 430 may be located between the first support member 410 and the rear plate 202, and may be coupled to the first support member 410 using a fastening element such as a bolt. At least a portion of the second board assembly 450 may be located between the first support member 410 and the third support member 430, and the third support member 430 may cover and protect the second board assembly 450. The second support member 420 and/or the third support member 430 may be made of a metal material and/or a non-metal material (e.g., polymer). In some embodiments, the second support member 420 serves as an electromagnetic shield for the first board assembly 440, and the third support member 430 serves as an electromagnetic shield for the second board assembly 450. In some embodiments, the second support member 420 and/or the third support member 430 may be referred to as a rear case.

According to some embodiments, a single board assembly including the first board assembly 440 and the second board assembly 450 may be implemented. For example, the substrate may include a first portion and a second portion located to be spaced apart from each other with the battery 460 interposed therebetween when viewed from above the rear plate 202 (e.g., when viewed in the +z-axis direction), and a third portion extending between the battery 460 and the side bezel structure 203 and interconnecting the first portion and the second portion. The third part may be implemented to be substantially rigid. In some embodiments, the third portion may be implemented to be substantially flexible. In some embodiments, a single support member including the second support member 420 and the third support member 430 may be implemented.

According to an embodiment, the antenna structure 470 may be located between the second support member 420 and the rear plate 202. In some embodiments, the antenna structure 470 may be located between the battery 460 and the rear plate 202. The antenna structure 470 may be implemented in the form of a film such as an FPCB. The antenna structure 470 may include at least one conductive pattern used as a loop-type radiator. For example, the at least one conductive pattern may include a planar spiral conductive pattern (e.g., a planar coil or a pattern coil). In an embodiment, at least one conductive pattern included in the antenna structure 470 may be electrically connected to a wireless communication circuit (or a wireless communication module) included in the first board assembly 440. For example, the at least one conductive pattern may be utilized for short-range wireless communication such as near field communication (NFC). As another example, the at least one conductive pattern may be utilized for magnetic secure transmission (MST) for transmitting and/or receiving a magnetic signal. In some embodiments, at least one conductive pattern included in the antenna structure 470 may be electrically connected to a power transmission/reception circuit included in the first board assembly 440. The power transmission/reception circuit may wirelessly receive power from an external electronic device or wirelessly transmit power to the external electronic device using at least one conductive pattern. The power transmission/reception circuit may include a power management module, for example, a power management integrated circuit (PMIC) or a charger integrated circuit (IC). The power transmission/reception circuit may charge the battery 460 using power wirelessly received using the conductive pattern.

According to an embodiment, the first adhesive member 480 may be positioned between the front plate 201 and the first support member 410. The front plate 201 may be coupled to the first support member 410 using the first adhesive member 480. The first adhesive member 480 may be disposed, for example, in an annular shape adjacent to the periphery (or the rim) of the front plate 201. The first adhesive member 480 may be provided in various other shapes that are not limited to the illustrated examples. In some embodiments, the first adhesive member 480 may include a plurality of adhesive members separated from each other. In this case, there may be a separate adhesive member or a filling member interconnecting the two adhesive members separated from each other.

According to an embodiment, the second adhesive member 490 may be located between the rear plate 202 and the first support member 410. The rear plate 202 may be coupled to the first support member 410 using the second adhesive member 490. The second adhesive member 490 may be disposed, for example, in an annular shape adjacent to the periphery (or the rim) of the rear plate 202. The second adhesive member 490 may be provided in various other shapes that are not limited to the illustrated examples. In some embodiments, the second adhesive member 490 may include a plurality of adhesive members separated from each other. In this case, there may be a separate adhesive member or a filling member interconnecting the two adhesive members separated from each other.

According to an embodiment, the first adhesive member 480 or the second adhesive member 490 may include various types of adhesive materials such as heat-reactive adhesive material, photo-reactive adhesive material, general adhesive, or a double-sided tape.

The electronic device 200 may further include various other components. Although it is difficult or impossible to list all of these components since numerous components exist in the art, the electronic device 200 may at least include components that are equivalent to the above-mentioned components. In certain embodiments, specific components may be excluded from the above components or replaced with other components according to the particular implementation of the electronic device.

Figure 5:
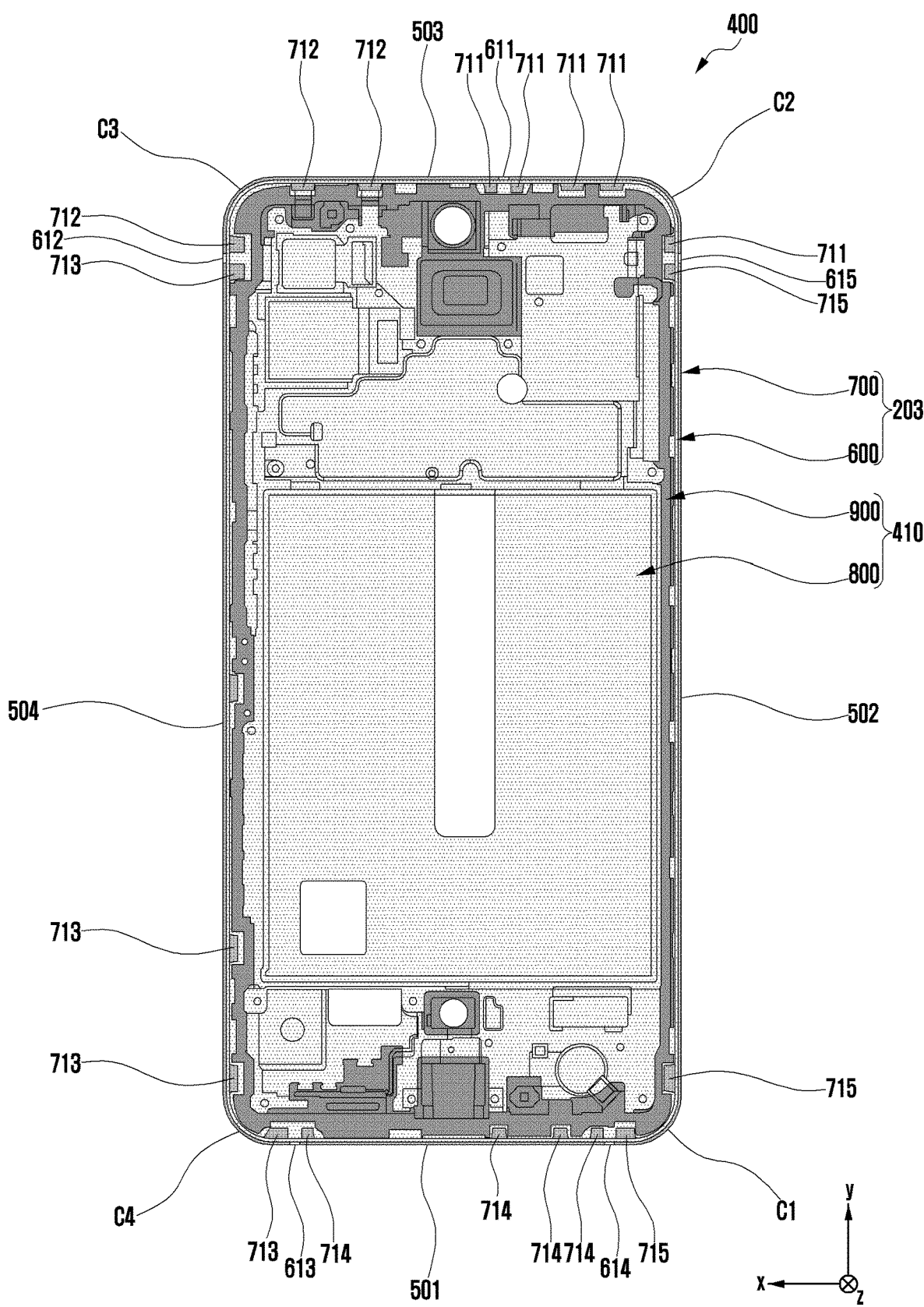
FIG. 5 is an x-y plan view of a front case, in an embodiment.
Figure 6:
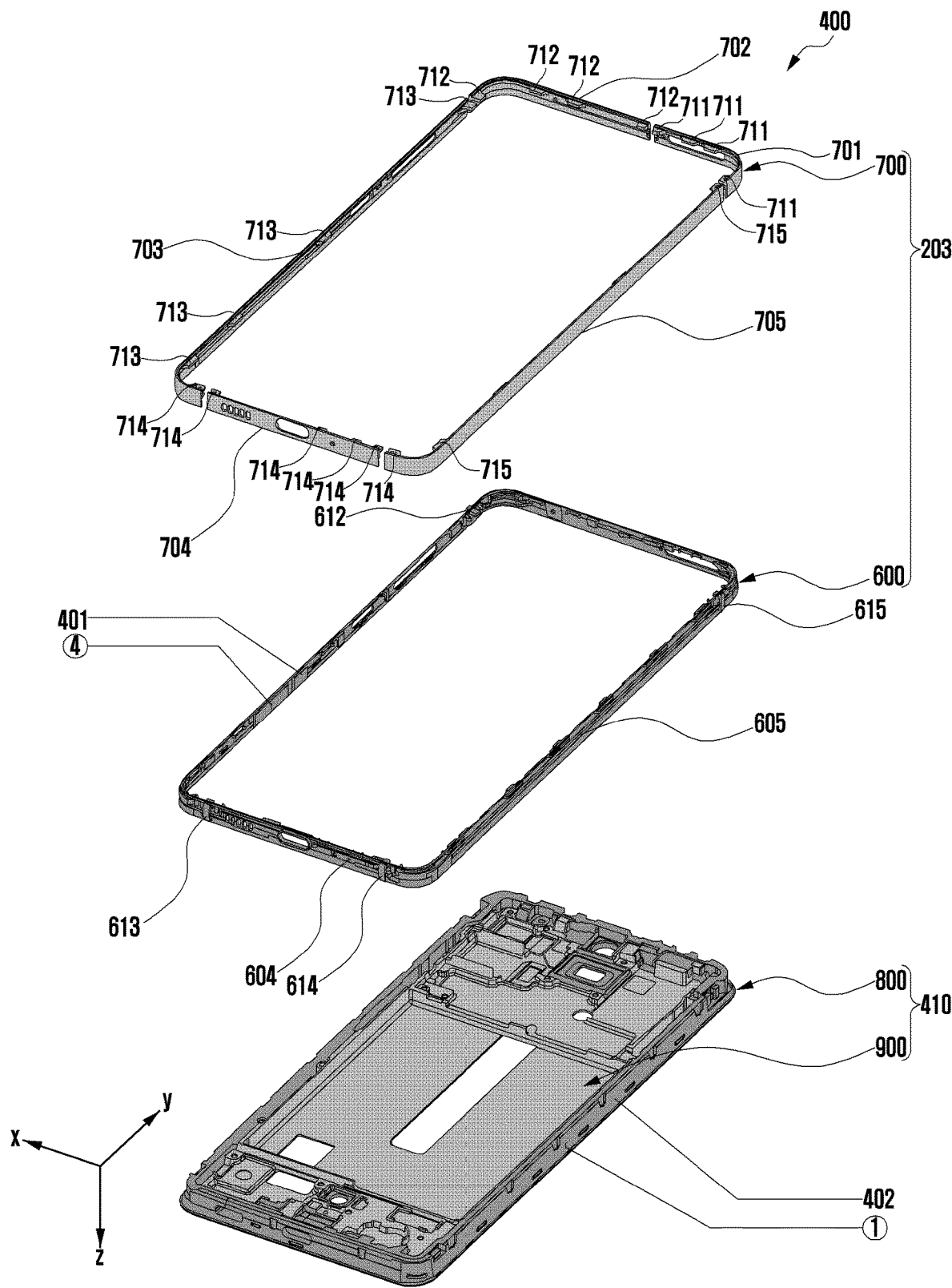
FIG. 6 is an exploded view of the front case, in an embodiment.
Figure 7:
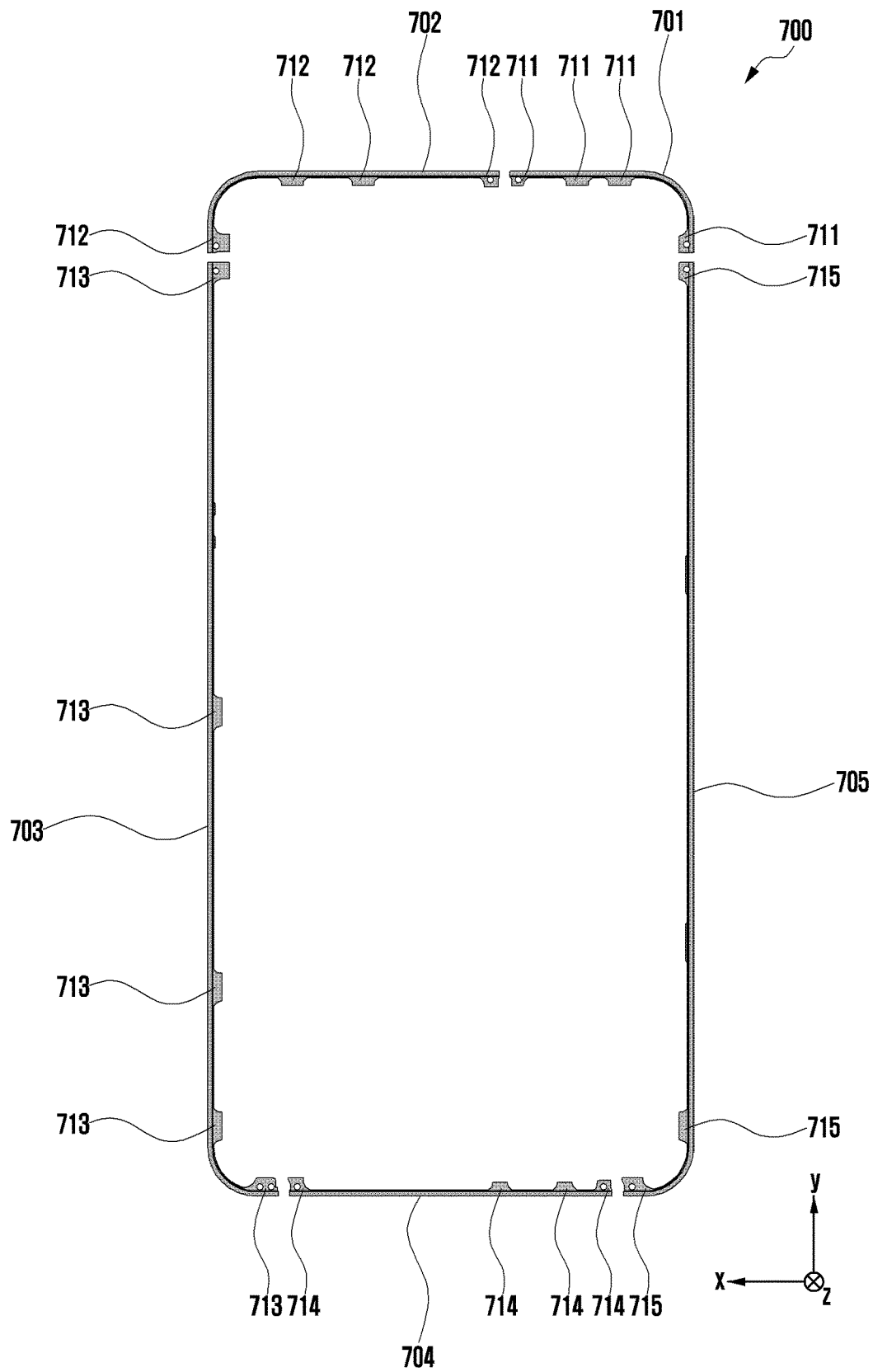
FIG. 7 is an x-y plan view of a first conductive structure included in a side member, in an embodiment.

FIG. 5 is an x-y plan view of a front case 400, in an embodiment. FIG. 6 is an exploded view of the front case 400, in an embodiment. FIG. 7 is an x-y plan view of a first conductive structure 700 included in the side member 203, in an embodiment.

Referring to FIG. 5, in an embodiment, the side member 203 of the front case 400 may be implemented in a quadrilateral annular shape. The side member 203 may include, for example, a first side portion (or a first bezel portion) 501, a second side portion (or a second bezel portion) 502, a third side portion (or a third bezel portion) 503, or a fourth side portion (or a fourth bezel portion) 504. The first side portion 501 and the third side portion 503 may be spaced apart from each other and extend in parallel to each other. The second side portion 502 may interconnect one end of the first side portion 501 and one end of the third side portion 503. The fourth side portion 504 may interconnect the other end of the first side portion 501 and the other end of the third side portion 503, and may be spaced apart from the second side portion 502 and extend in parallel to the second side portion 502. A first corner portion C1 in which the first side portion 501 and the second side portion 502 are connected to each other, a second corner portion C2 in which the second side portion 502 and the third side portion 503 are connected to each other, a third corner portion C3 in which the third side portion 503 and the fourth side portion 504 are connected to each other, and/or a fourth corner portion C4 in which the first side portion 501 and the fourth side portion 504 are connected to each other may be provided in a round shape. The first side portion 501 and the third side portion 503 may have a first length extending in the x-axis direction, and the second side portion 502 and the fourth side portion 504 may have a second length extending in the y-axis direction. The second length may be greater than the first length. In some embodiments, the first length and the second length may be substantially the same.

According to an embodiment, in order to reduce damage of the corner portions (e.g., the first corner portion C1, the second corner portion C2, the third corner portion C3, and the fourth corner portions C4) against external impacts applied to the electronic device 200 such as when the electronic device 200 is dropped, the corner portions may be formed to be thicker than the first side portion 501, the second side portion 502, the third side portion 503, and the fourth side portion 504 when viewed in the z-axis direction.

Referring to FIGS. 5, 6, and 7, in an embodiment, the side member 203 may include a first non-conductive structure 600 and a first conductive structure 700.

According to an embodiment, the first non-conductive structure (or a first non-metal structure) 600 may be in an integrated quadrilateral annular shape with no segmented portion (or not divided into a plurality of portions). The first conductive structure (or a first metal structure) 700 may be disposed on the first non-conductive structure 600 to define a portion of the side surface 210C (see FIG. 2) of the electronic device 200. In an embodiment, the first conductive structure 700 may include a plurality of conductive portions 701, 702, 703, 704, and 705. The plurality of conductive portions 701, 702, 703, 704, and 705 may include, for example, a first conductive portion 701, a second conductive portion 702, a third conductive portion 703, a fourth conductive portion 704, and a fifth conductive portion 705, which are disposed along the side surface 201c (see FIG. 2) of the electronic device 200 to be physically separated from each other while being disposed with the non-conductive structure 600. In an embodiment, the first non-conductive structure 600 may include a first recess structure (not illustrated) into which the first conductive portion 701 can be fitted, a second recess structure (not illustrated) into which the second conductive portion 702 can be fitted, a third recess structure (not illustrated) into which the third conductive portion 703 can be fitted, and a fourth recess structure 604 into which the fourth conductive portion 704 can be fitted, and a fifth recess structure 605 into which the fifth conductive portion 705 can be fitted. In an embodiment, the plurality of conductive portions 701, 702, 703, 704, and 705 may be coupled to the first non-conductive structure 600 using snap-fit fastening. For example, the snap-fit fastening for the first conductive portion 701 may include at least one hook structure disposed in a portion of the first non-conductive structure 600 that corresponds to the first conductive portion 701. The snap-fit fastening further may include a hook fastening structure that is disposed in the conductive portion 701 such that the at least one hook structure can be fastened to the hook fastening structure. The snap-fit fastening for the second conductive portion 702, the third conductive portion 703, the fourth conductive portion 704, or the fifth conductive portion 705 may be configured to be substantially the same as the snap-fit fastening for the first conductive portion 701. In some embodiments, the plurality of conductive portions 701, 702, 703, 704, and 705 may be coupled to the first non-conductive structure 600 using screw fastening. Snap-fit fastening or screw fastening may enable replacement of the first non-conductive structure 600 or the first conductive structure 700 when the replacement is required due to, for example, damage.

According to some embodiments, a polymer adhesive material or sealant may be interposed between the first non-conductive structure 600 and the first conductive structure 700.

According to some embodiments, the first non-conductive structure 600 may be molded to be coupled to the first conductive structure 700 using insert molding. For example, an integrated structure in which the first conductive structure 700 and the first non-conductive structure 600 are coupled to each other may be molded by placing the first conductive structure 700 in a mold, injecting a molten resin into the mold, and then cooling and taking out a molded product. In some embodiments, after disposing an organic adhesive layer (e.g., polymer adhesive material or sealant) on the first conductive structure 700, the first non-conductive structure 600 bonded to the organic adhesive layer may be manufactured via insert molding. The first conductive structure 700 may be firmly and tightly bonded to the first non-conductive structure 600 molded through injection molding due to the organic adhesive layer (e.g., TRI bonding). The organic adhesive layer may increase the bonding force between the first non-conductive structure 600 and the first conductive structure 700 and may contribute to waterproofing. The organic adhesive layer may include various polymers or sealants such as triazine thiol, 2,4-dithio pyrimidine, or a silane-based compound. In some embodiments, the first non-conductive structure 600 bonded to the organic adhesive layer may be molded by anodizing the first conductive structure 700, forming the organic adhesive layer applied to the first conductive structure 700, and then performing insert molding. For example, the organic adhesive layer may be applied to the first conductive structure 700 by making current flow through an electrolyte solution (e.g., sulfuric acid solution or nitric acid solution). A metal oxide and/or carbon may be included in the organic adhesive layer formed on the first conductive structure 700 due to the method of applying the organic adhesive layer to the first conductive structure 700 by making current flow through the electrolyte solution. For example, in the case in which the first conductive structure 700 includes aluminum (Al), the organic adhesive layer may include aluminum, oxygen, and/or carbon due to the method of applying the organic adhesive layer to the first conductive structure 700 by making current flow through the electrolyte solution.

According to an embodiment, the side member 203 may include a plurality of insulating portions 611, 612, 613, 614, and 615 provided by the first non-conductive structure 600. The plurality of insulating portions 611, 612, 613, 614, and 615 may include, for example, a first insulating portion 611 extending into a segmented portion between the first conductive portion 701 and the second conductive portion 702, a second insulating portion 612 extending into a segmented portion between the second conductive portion 702 and the third conductive portion 703, a third insulating portion 613 extending into a segmented portion between the third conductive portion 703 and the fourth conductive portion 704, a fourth insulating portion 614 extending into a segmented portion between the fourth conductive portion 704 and the fifth conductive portion 705, and a fifth insulating portion 615 extending into a segmented portion between the fifth conductive portion 705 and the first conductive portion 701. The plurality of insulating portions 611, 612, 613, 614, and 615 may define a portion of the side surface 210C (see FIG. 2) of the electronic device 200. The side surface 210C may include first areas defined by the plurality of conductive portions 701, 702, 703, 704, and 705 of the first conductive structure 700. The side surface 210C may include second areas defined by the plurality of insulating portions 611, 612, 613, 614, and 615 of the first non-conductive structure 600. The first areas and the second areas of the side surface 210C may be smoothly connected to each other without a substantial difference in height. The shape or number of conductive portions included in the first conductive structure 700 and the shape or number of insulating portions corresponding to the conductive portions are not limited to the illustrated examples and may vary.

According to an embodiment, at least a portion of the first conductive structure 700 may be electrically connected to a wireless communication circuit (e.g., the wireless communication module 192 in FIG. 1) to operate as an antenna radiator. For example, the wireless communication circuit may be configured to transmit and/or receive signals in a selected or predetermined frequency band via the first conductive portion 701, the second conductive portion 702, the third conductive portion 703, the fourth conductive portion 704, or the fifth conductive portion 705.

According to an embodiment, the first support member 410 of the front case 400 may include a second non-conductive structure 800 and a second conductive structure 900. In an embodiment, at least a portion of the second non-conductive structure 800 may be disposed between the side member 203 and the second conductive structure 900 when viewed from above the rear plate 202 (see FIG. 3) (e.g., when viewed in the +z-axis direction). The second non-conductive structure 800 may extend to at least partially face, for example, the first non-conductive structure 600 of the side member 203. In an embodiment, the second non-conductive structure 800 may be molded to be coupled to the second conductive structure 900 using insert molding. For example, an integrated first support member 410 in which the second non-conductive structure 800 is coupled to the second conductive structure 900 may be manufactured by placing the second conductive structure 900 in a mold, injecting a molten resin into the mold, and then cooling and taking out the molded product. In some embodiments, an organic adhesive layer may be interposed between the second non-conductive structure 800 and the second conductive structure 900. For example, the second non-conductive structure 800 bonded to the organic adhesive layer may be manufactured via insert molding after disposing an organic adhesive layer (e.g., a polymer adhesive material or sealant) on the second conductive structure 900. The second conductive structure 900 may be firmly and tightly bonded to the second non-conductive structure 800 molded through injection molding due to the organic adhesive layer (e.g., TRI bonding). The organic adhesive layer may increase the bonding force between the second non-conductive structure 800 and the second conductive structure 900 and may contribute to waterproofing. The organic adhesive layer may include, for example, various polymers or sealants such as triazine thiol, 2,4-dithio pyrimidine, or a silane-based compound. In some embodiments, the second non-conductive structure 800 bonded to the organic adhesive layer may be molded by anodizing the second conductive structure 900, forming the organic adhesive layer applied to the second conductive structure 900, and then performing insert molding. For example, the organic adhesive layer may be applied to the second conductive structure 900 by making current flow through an electrolyte solution (e.g., sulfuric acid solution or nitric acid solution). A metal oxide and/or carbon may be included in the organic adhesive layer formed on the second conductive structure 900 due to the method of applying the organic adhesive layer to the second conductive structure 900 by making current flow through the electrolyte solution. For example, in the case in which the second conductive structure 900 includes aluminum (Al), the organic adhesive layer may include aluminum, oxygen, and/or carbon due to the method of applying the organic adhesive layer to the second conductive structure 900 by making current flow through the electrolyte solution.

According to some embodiments, the first conductive structure 700 of the side member 203 may be referred to as an outer conductive structure of the electronic device 200 (see FIG. 2) or the housing 210 (see FIG. 2), and the second conductive structure 900 of the first support member 410 may be referred to as an inner conductive structure of the electronic device 200 or the housing 210.

According to an embodiment, the side member 203 may be detachable from the first support member 410. The first non-conductive structure 600 of the side member 203 may include a first connection structure 401 for coupling with the second non-conductive structure 800 of the first support member 410. The first connection structure 401 may define a fourth surface ④ of the front case 400. The fourth surface ④ may refer to an area of the first non-conductive structure 600 that at least partially faces the second non-conductive structure 800 of the first support member 410. The second non-conductive structure 800 of the first support member 410 may include a second connection structure 402 for coupling with the first non-conductive structure 600 of the side member 203. The second connection structure 402 may define a first surface ① of the front case 400. The first surface ① may refer to an area of the first support member 410 that at least partially faces the first non-conductive structure 600 of the side member 203. The first surface ① and the fourth surface ④ may face each other, and may extend in a quadrilateral annular shape along the side surface 210C (see FIG. 2) of the electronic device 200.

In some embodiments, the first surface ① may not be substantially exposed to the outside from the front case 400 or the electronic device 200, and may be referred to as a "first inner surface". The fourth surface ④ may not be substantially exposed to the outside from the front case 400 or the electronic device 200, and may be referred to as a "fourth inner surface".

According to an embodiment, between the first connection structure 401 and the second connection structure 402 (or between the fourth surface ④ and the first surface ①), there may be a plurality of fastening structures for detachment/attachment of the side member 203. The plurality of fastening structures will be described with reference to FIG. 8.

According to an embodiment, the first conductive structure 700 of the side member 203 may be connected to the second conductive structure 900 of the first support member 410. For example, the first conductive structure 700 and the second conductive structure 900 may be mechanically and electrically connected to each other using a conductive adhesive material. As another example, the first conductive structure 700 and the second conductive structure 900 may be mechanically and electrically connected to each other using screw fastening. The mechanical connection of the first conductive structure 700 and the second conductive structure 900 may contribute to durability or rigidity of the front case 400 by forming an integrated structure. For example, with respect to external impacts (e.g., impacts caused by drop of the electronic device 200), the mechanical connection between the first conductive structure 700 and the second conductive structure 900 may suppress or reduce separation of the first conductive structure 700 from the first non-conductive structure 600, or deformation or damage of the first conductive structure 700.

According to an embodiment, the first conductive structure 700 may include a plurality of extensions 711, 712, 713, 714, and 715 for electrical and/or mechanical connection with the second conductive structure 900. The plurality of extensions 711, 712, 713, 714, and 715 may overlap the first support member 410 when viewed from above the rear plate 202 (see FIG. 3) (e.g., when viewed in the +z-axis direction). In an embodiment, the plurality of extensions 711, 712, 713, 714, and 715 may be located to penetrate the first non-conductive structure 600. The plurality of extensions 711, 712, 713, 714, and 715 may include, for example, a plurality of first extensions 711 extending from the first conductive portion 701, a plurality of second extension portions 712 extending from the second conductive portion 702, a plurality of third extension portions 713 extending from the third conductive portion 703, a plurality of fourth extension portions 714 extending from the fourth conductive portion 704, and a plurality of fifth extension portions 715 extending from the fifth conductive portion 705. The positions or numbers of extensions are not limited to the illustrated examples and may vary.

According to an embodiment, the first non-conductive structure 600 of the side member 203 or the second non-conductive structure 800 of the first support member 410 may include various polymers such as engineering plastic (e.g., polycarbonate (PC) or polymethyl methacrylate (PMMA)). The first non-conductive structure 600 or the second non-conductive structure 800 may include a polymer resin, such as polyether ether ketone, polyphenylene sulfide, polybutylene terephthalate, polyimide, or polycarbonate. In some embodiments, the first non-conductive structure 600 or the second non-conductive structure 800 may include a material (e.g., fiber-reinforced plastic (FRP)) obtained by mixing engineering plastic with various reinforcing base materials such as glass fiber or carbon fiber.

According to an embodiment, the first non-conductive structure 600 of the side member 203 and the second non-conductive structure 800 of the first support member 410 may include different non-metal materials. In some embodiments, the first non-conductive structure 600 and the second non-conductive structure 800 may include the same non-metal material.

According to an embodiment, the first conductive structure 700 of the side member 203 may include a first metal material. The second conductive structure 900 of the first support member 410 may include a second metal material different from the first metal material. The first metal material may include, for example, titanium, an amorphous alloy, a metal-ceramic composite material (e.g., cermet), or stainless steel. The second metal material may include, for example, magnesium, a magnesium alloy, aluminum, an aluminum alloy, a zinc alloy, or a copper alloy. In some embodiments, the first metal material is a metal material different from the second metal material, and may include, for example, magnesium, a magnesium alloy, aluminum, an aluminum alloy, a zinc alloy, or a copper alloy. The first metal material or the second metal material may be further diversified. The first conductive structure 700 or the second conductive structure 900 may be shaped using various machining methods such as computer numerical control (CNC), die casting, or pressing.

According to an embodiment, the first non-conductive structure 600 and the first conductive structure 700 of the side member 203 may be separately shaped and then coupled to each other. In some embodiments, the first non-conductive structure 600 may be molded to couple with the first conductive structure 700 using insert molding.

According to an embodiment, the method of manufacturing the front case 400 by manufacturing the side member 203 and the first support member 410 separately and then coupling the side member 203 and the first support member 410 to each other may contribute to ease of manufacture and a production yield when compared to another method of implementing an integrated front case from which the side member and the first support member are difficult to separate. The front case according to the comparative example may be molded in an integrated form in which the non-conductive structure is coupled to the conductive structure, for example, by placing the conductive structure in a mold, injecting a molten resin into the mold, and then cooling and taking out the molded product (e.g., insert molding). When there is a quality defect with respect to the side member or the first support member of the integrated front case in the comparative example, cost may increase and manufacture yield may decrease as compared with the method of separately manufacturing the side member 203 and the first support member 410. Quality defects may include, for example, color defect or poor surface roughness that may occur during surface processing such as anodic oxidation (or anodizing) or coating or a change in a physical property (e.g., reduction in rigidity due to a sulfuric acid solution or a strongly acidic solution such as a nitric acid solution during anodizing). When changes in the shape of the side member or the first support member of the integral front case in the comparative example is required in order to reduce damage due to external impacts applied in situations such as drops, compared with the method of separately manufacturing the side member 203 and the first support member 410, cost increase may be caused due to, for example, re-manufacturing of the mold.

Figure 8:
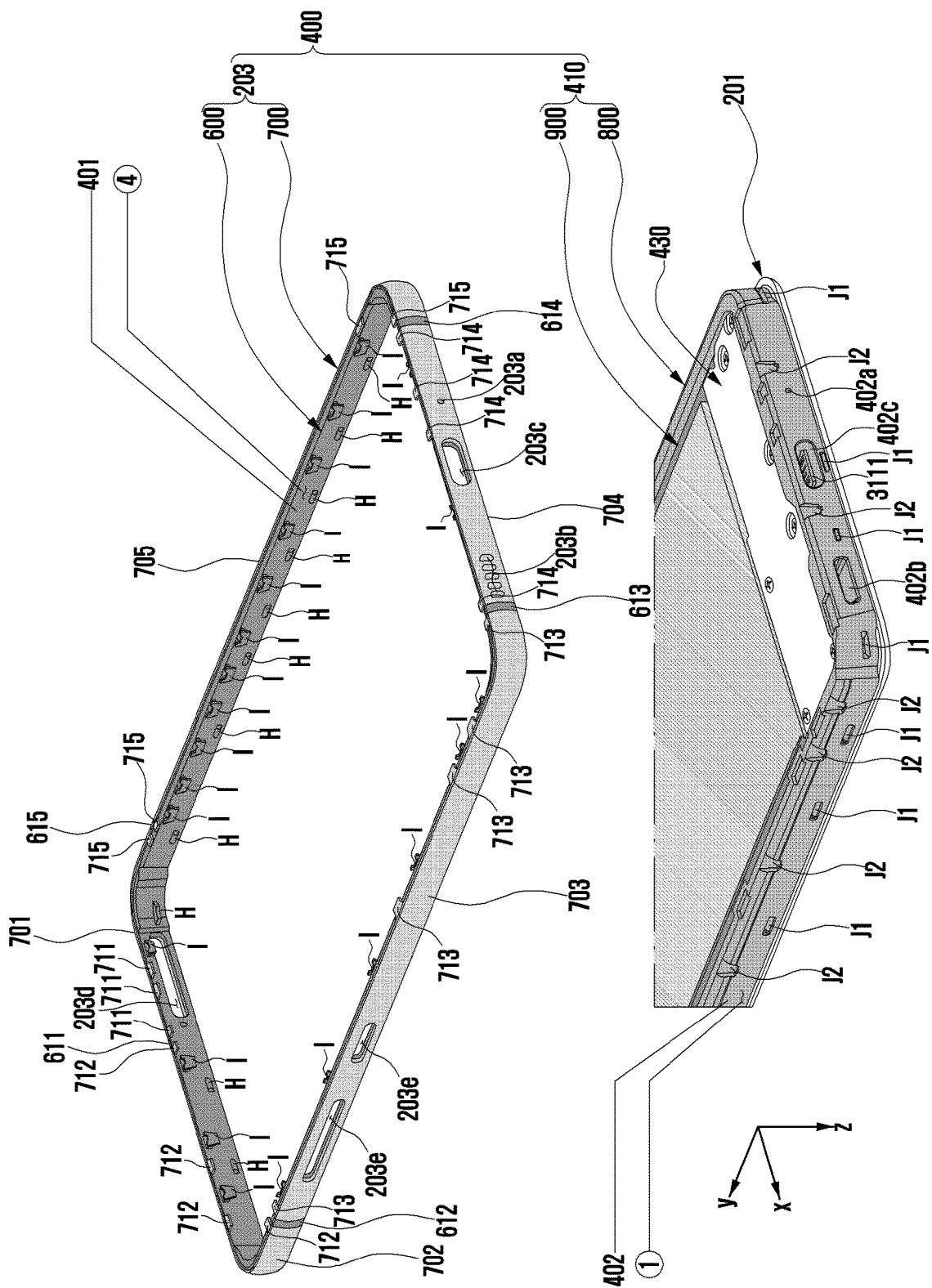
FIG. 8 illustrates a front plate, a front case, a first support member, a third support member, or a battery, in an embodiment.

FIG. 8 illustrates a front plate 201, a front case 400, a first support member 410, a third support member 430, and/or a battery 460, in an embodiment.

Referring to FIG. 8, for example, the first conductive structure 700 included in the side member 203 of the front case 400 may include a plurality of conductive portions 701, 702, 703, 704, and 705, and a plurality of extensions 711, 712, 713, 714, and 715 extending from the conductive portions 701, 702, 703, 704, and 705, respectively. The plurality of extensions 711, 712, 713, 714, and 715 may be mechanically and electrically connected to the second conductive structure 900 of the first support member 410. The first non-conductive structure 600 included in the side member 203 of the front case 400 may provide a plurality of insulating portions 611, 612, 613, 614, and 615 located to correspond to the plurality of conductive portions 701, 702, 703, 704, and 705, respectively.

According to an embodiment, the first non-conductive structure 600 of the side member 203 may include a first connection structure 401 defining the fourth surface ④ of the front case 400. The second non-conductive structure 800 of the first support member 410 may include a second connection structure 402 defining the first surface ① of the front case 400. The front case 400 may include a parting area (not illustrated) provided between the first surface ① and the fourth surface ④. The parting area may refer to a portion of the front case 400 at which the side member 203 and the first support member 410 are separated from each other. The parting area may include, for example, a first parting area, a second parting area, a third parting area, a fourth parting area, a first corner parting area, a second corner parting area, a third corner parting area, or a fourth corner parting area. The first parting area may be located to correspond to the first side portion 501 (see FIG. 5). The second parting area may be located to correspond to the second side portion 502 (see FIG. 5). The third parting area may be located to correspond to the third side portion 503 (see FIG. 5). The fourth parting area may be located to correspond to the fourth side portion 504 (see FIG. 5). The first corner parting area may be located to correspond to the first corner portion C1 (see FIG. 5), and may interconnect the first parting area and the second parting area. The second corner parting area may be located to correspond to the second corner portion C2 (see FIG. 5), and may interconnect the second parting area and the third parting area. The third corner parting area may be located to correspond to the third corner portion C3 (see FIG. 5), and may interconnect the third parting area and the fourth parting area. The fourth corner parting area may be located to correspond to the fourth corner portion C4 (see FIG. 5), and may interconnect the first parting area and the fourth parting area.

According to an embodiment, the side member 203 may be moved in a direction (e.g., the +z-axis direction) from the rear plate 202 (see FIG. 3) to the front plate 201 to be engaged with the first support member 410. The front case 400 may include a plurality of fastening structures between the first connection structure 401 of the side member 203 and the second connection structure 402 of the first support member 410. The plurality of fastening structures may enable detachment/attachment of the side member 203 with respect to the first support member 410.

According to an embodiment, the plurality of fastening structures between the first connection structure 401 and the second connection structure 402 may include a plurality of first fastening structures. The plurality of first fastening structures may include, for example, a plurality of hooks H provided in the fourth surface ④ and a plurality of hook joints J1 provided in the first surface ①. The plurality of hook joints J1 may include an under-cut structure (or a hooking structure) in the form of recesses or grooves corresponding to the plurality of hooks H. When the side member 203 is moved in a direction (e.g., the +z-axis direction) from the rear plate 202 (see FIG. 3) to the front plate 201 to be engaged with the first support member 410, the plurality of hooks 630 may be fastened to the plurality of hook joints J1 in a manner of snap-fit fastening.

According to an embodiment, the plurality of fastening structures may include a plurality of second fastening structures. The plurality of second fastening structures may include, for example, a plurality of inserts I provided in the fourth surface ④ and a plurality of insert joints J2 provided in the first surface ①. The plurality of insert joints J2 may include recess or groove-type fitting structures (or fitting structures) corresponding to a plurality of inserts I. When the side member 203 is moved in a direction (e.g., the +z-axis direction) from the rear plate 202 (see FIG. 3) to the front plate 201 to be engaged with the first support member 410, the plurality of inserts I may be inserted into the plurality of insert joints J2. The plurality of second fastening structures including the plurality of inserts I and the plurality of insert joints J2 may guide the position or direction in which the side member 203 is coupled to the first support member 410.

According to some embodiments (not illustrated), a buffer member (or a buffer material) capable of mitigating external impact may be interposed between the first surface ① and the fourth surface ④. The buffer member may contribute to reducing damage to the side member 203 in response to external impacts or maintaining the coupling between the side member 203 and the first supporting member 410.

According to an embodiment, the side member 203 may include at least one opening. The side member 203 may include, for example, a first microphone hole 203a of the first audio module 302 (see FIG. 2), a first speaker hole 230b of the third audio module 304 (see FIG. 2), and a connector hole 203c of the connection terminal module 311 (see FIG. 2). The side member 203 may include a connector hole 203d corresponding to a connector for detaching/attaching, for example, an external storage medium (e.g., a memory card such as a secure digital (SD) card or a subscriber identity module (SIM) card). The side member 203 may include, for example, key holes 203e corresponding to key input devices (e.g., the input modules 310 in FIG. 2).

According to an embodiment, the first support member 410 may include a plurality of hole structures. The second connection structure 402 may include, for example, a first hole structure 402a aligned with the first microphone hole 203a of the side member 203. A first microphone (not illustrated) of the first audio module 302 (see FIG. 2) may be located to correspond to the first hole structure 541. The second connection structure 402 may include, for example, a second hole structure 402b aligned with the first speaker hole 203b of the side member 203. The first microphone (not illustrated) of the third audio module 304 (see FIG. 2) may be located to correspond to the second hole structure 402b. The second connection structure 402 may include, for example, a third hole structure 402c aligned with the connector hole 203c of the side member 203. The first connector 3111 of the connection terminal module 311 (see FIG. 2) may be located to correspond to the third hole structure 402c. The second connection structure 402 may include, for example, a fourth hole structure (not illustrated) aligned with the connector hole 203d of the side member 203. The third connector (not illustrated) may be located to correspond to the fourth hole structure. The second connection structure 402 may include, for example, fifth hole structures (not illustrated) aligned with the key holes 203e of the side member 203. The key input devices 310 (see FIG. 2) may be located to correspond to the fifth hole structures.

Figure 9:
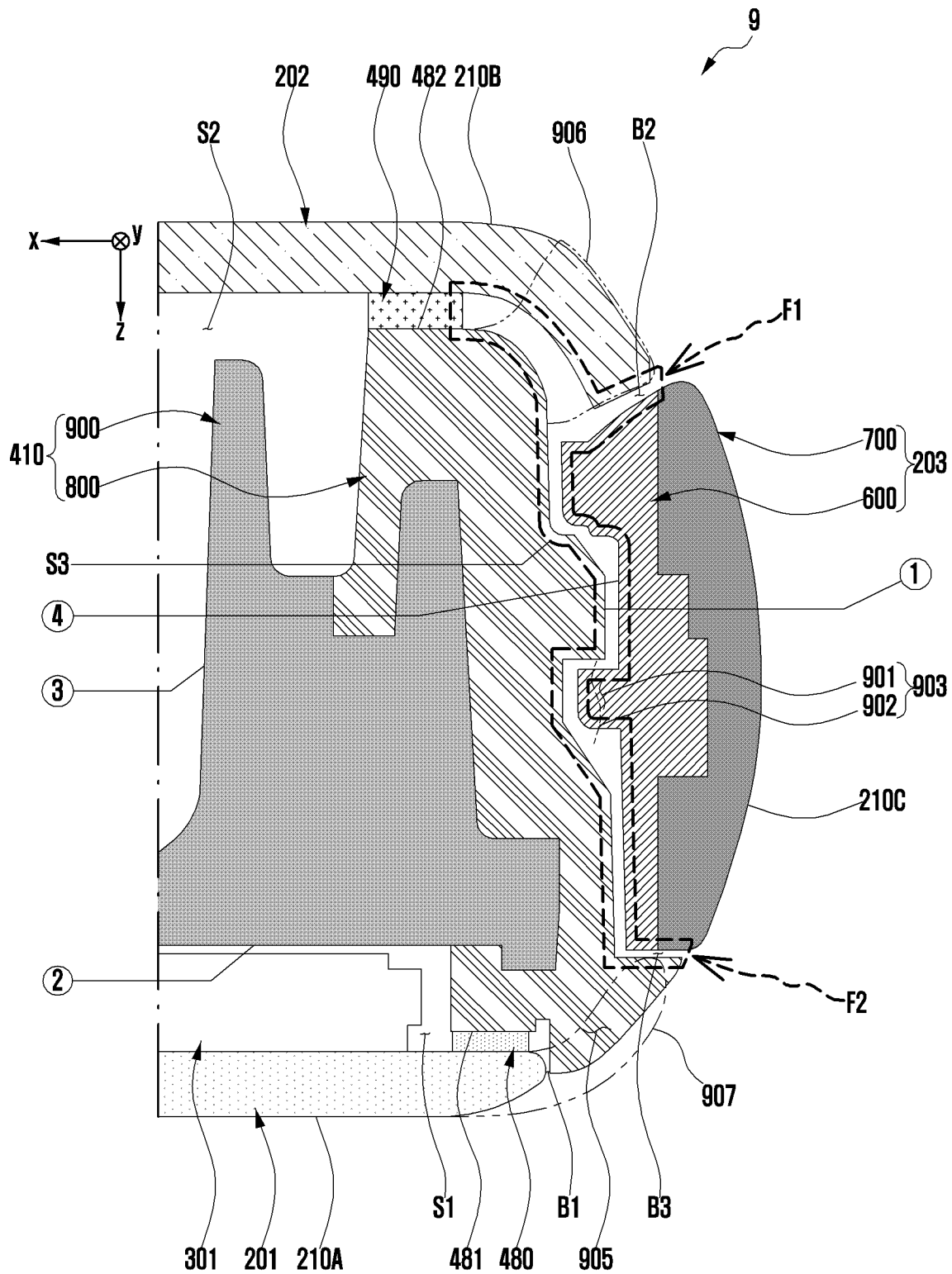
FIG. 9 illustrates a cross-sectional structure in an x-z plane of a portion of the electronic device taken along line A-A' in FIG. 3, in an embodiment.
Figure 10:
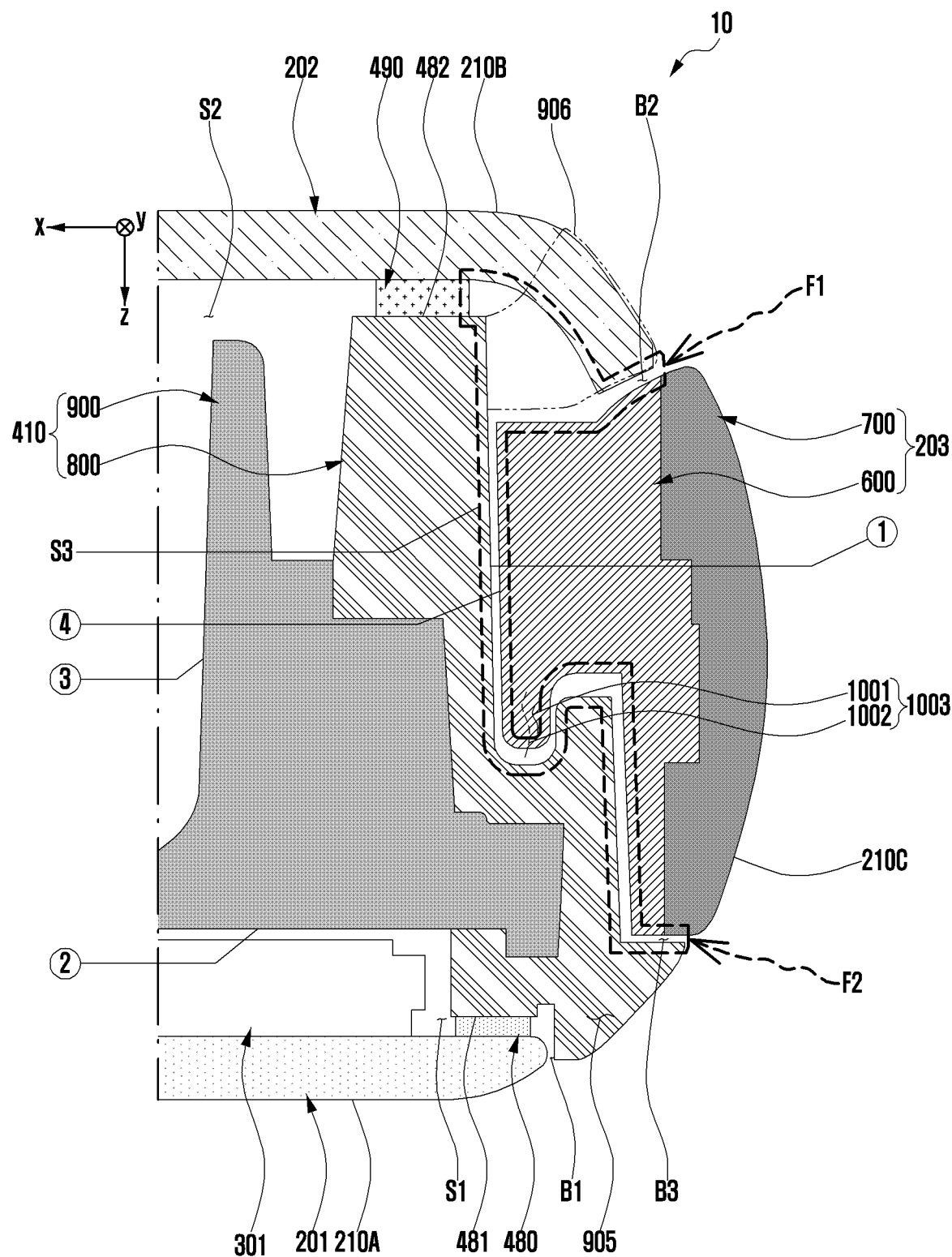
FIG. 10 illustrates a cross-sectional structure in an x-z plane of a portion of the electronic device taken along line B-B' in FIG. 3, in an embodiment.

FIG. 9 illustrates a cross-sectional structure 9 in an x-z plane of a portion of the electronic device 200 taken along line A-A' in FIG. 3, in an embodiment. FIG. 10 illustrates a cross-sectional structure 10 in an x-z plane of a portion of the electronic device 200 taken along line B-B' in FIG. 3, in an embodiment.

FIGS. 9 and 10 illustrate, for example, the side member 203, the first support member 410, the front plate 201, the rear plate 202, the first adhesive member 480, and the second adhesive member 490, and the display 301. The side member 203 may include a first non-conductive structure 600 and a first conductive structure 700. The first support member 410 may include a second non-conductive structure 800 and a second conductive structure 900.

According to an embodiment, the side member 203 may define the side surface 210C and the fourth surface ④ of the electronic device 200. The 4th surface ④ may be defined by the first non-conductive structure 600 of the side member 203. The first support structure 410 may define the first surface ① of the front case 400. The first surface ① and the fourth surface ④ face each other, and may extend in the annular shape of the side surface 210C when viewed from above the rear surface 210B (e.g., in the +z-axis direction). In an embodiment, the first fastening structure 903 may include a hook 901 provided in the fourth surface ④ and a hook joint 902 provided in the first surface ①. For example, the illustrated hook 901 may be a hook H among the plurality of hooks H (see FIG. 8) that coincide with the line A-A' of FIG. 3. The illustrated hook joint 902 may be a hook joint J1 among the plurality of hook joints J1 (see FIG. 8) that correspond with the hook 901. In an embodiment, the second fastening structure 1003 may include an insert 1001 provided in the fourth surface ④ and an insert fastening portion 1002 provided in the first surface ①. For example, the illustrated insert 1001 may be one insert I among the plurality of inserts I (see FIG. 8) that coincide with the line B-B' of FIG. 3. The illustrated insert fastening portion 1002 may be one insert fastening portion among the plurality of insert joints J2 (see FIG. 8) that correspond with the insert 1001. Although not illustrated, the cross-sectional structure having the first fastening structure at another position may be configured to be substantially the same as or at least partially similar to the cross-sectional structure 9 of the x-z plane corresponding to the second side portion 502 (see FIG. 5). Although not illustrated, the cross-sectional structure having the second fastening structure at another position may be configured to be substantially the same as or at least partially similar to the cross-sectional structure 10 of the x-z plane corresponding to the second side portion 502 (see FIG. 5). Although not illustrated, the cross-sectional structure at a position that does not include the first fastening structure and the second fastening structure may have a form in which the first fastening structure 903 is not included in the cross-sectional structure 9 of FIG. 9, or a form in which the second fastening structure 1003 is not included in the cross-sectional structure 10 of FIG. 10.

According to an embodiment, the first support member 410 may include a second surface (or a second inner surface) ② located to correspond to the front plate 201. The second surface ② may be located separately from the first surface ① with reference to the first adhesive member 480. The second surface ② may be separated from the first surface ① with the first adhesive member 480 interposed therebetween. At least one electronic component, such as the display 301, may be located between the front plate 201 and the second surface ②. At least one electronic component may be disposed on the second surface ② or may be supported by the second surface ②. The second surface ② may be defined in a shape on which at least one electronic component is disposed or supported. The second surface ② may have various shapes such as concavo-convex shape, but in the disclosure, the second surface may be defined as a surface located at the front plate 201 side in the first support member 410 (or located to face the front plate 201 or located to at least partially face the front plate 201). The first support member 410 may include a third surface (or a third inner surface) ③ located opposite to the second surface ② to correspond to the rear plate 202. For example, the third surface ③ may be located to be separated from the first surface ① with reference to the second adhesive member 490. The second surface ② may be separated from the first surface ① with the second adhesive member 490 interposed therebetween. At least one electronic component, such as the first board assembly 440, the second board assembly 450, or the battery 460 illustrated in FIG. 4, may located between the rear plate 202 and the third surface ③. At least one electronic component may be disposed on the third surface ③ or may be supported by the third surface ③. The third surface ③ may be defined in a shape on which at least one electronic component is disposed or supported. The third surface ③ may have various shapes such as concavo-convex shape, but in the disclosure, the second surface may be defined as a surface located at the rear plate 202 side in the first support member 410 (or located to face the rear plate 202 or located to at least partially face the rear plate 202). In an embodiment, at least one electronic component located between the front plate 201 and the second surface ② may be electrically connected to at least one electronic component located between the rear plate 202 and the third surface ③ via an electrical path (e.g., a flexible printed circuit board or a cable) located through the opening in the first support member 410, which is penetrated by the second surface ② and the third surface ③.

According to an embodiment, the second non-conductive structure 800 of the first support member 410 may include an annular first side rim portion 905 extending to the space between the side member 203 and the front plate 201 to define a portion of the side surface 210C. In an embodiment, the first side rim portion 905 may cover at least a portion of the side surface (e.g., the side surface interconnecting the front surface 210A and the rear surface) of the front plate 201. In some embodiments, at least a portion of the first side rim portion 905 may be provided by an extended portion of the second conductive structure 900. In some embodiments, at least a portion of the first side rim portion 905 may be provided by an extended portion of the first non-conductive structure 600 and/or the first conductive structure 700 of the side member 203. With respect to external impacts (e.g., impacts caused by the drop of the electronic device 200), the first side rim portion 905 may reduce the effect of stress on the front plate 201 and/or the display 301, thereby contributing to reduction of damage to the front plate 201 and/or the display 301. With respect to other types of external stress, the first side rim portion 905 may reduce stress on the bonding structure between the front plate 201 and the first support member 410, (e.g. the first adhesive member 480), thereby contributing to reduction of damage to the bonding structure and securing waterproofing performance thereby.

According to some embodiments, the first side rim portion 905 may be omitted or reduced compared to the illustrated example, and the side member 203 or the front plate 201 may be implemented in a further expanded form. For example, the front plate 201 may be expanded to replace at least a portion of the first side rim portion 905, and may further include a curved portion extending toward the side member 203 as illustrated by the alternate long and two short dashes line indicated by reference numeral "907". The curved portion 907 of the front plate 201 and the curved portion of the rear plate 202 may be located opposite to each other. In some embodiments, the curved portion 907 of the front plate 201 and the curved portion of the rear plate 202 may be arranged to be symmetrical to each other. In some embodiments, the display 301 may be a flexible display and may extend to the curved portion 907.

According to some embodiments, the second non-conductive structure 800 of the first support member 410 may include an annular second side rim portion (see the alternate long and two short dashes line indicated by reference numeral "906") extending to a space between the side member 203 and the rear plate 202 to define a portion of the side surface 210c. In this case, the rear plate 202 may be provided in a shape corresponding to the second side rim portion 906 unlike the illustrated example. In some embodiments, at least a portion of the second side rim portion 906 may be provided by an extended portion of the second conductive structure 900. In some embodiments, at least a portion of the second side rim portion 906 may be provided by an extended portion of the first non-conductive structure 600 and/or the first conductive structure 700 of the side member 203.

According to an embodiment, the first adhesive member 480 may be located between the front plate 201 and the first support member 410 to be adjacent to the periphery of the front plate 201. The first adhesive member 480 may be disposed in, for example, a first area 481 included the second surface ② of the first support member 410. The first area 481 may be, for example, a partial area of the second surface ② that is located adjacent to the periphery of the front plate 201 and faces the rear surface of the front plate 201 (e.g., the surface opposite to the front surface 210A). In an embodiment, at least a portion of the first area 481 may be provided by the second non-conductive structure 800 of the first support member 410. In some embodiments (not illustrated), at least a portion of the first area 481 may be provided by the second conductive structure 900 of the first support member 410. In some embodiments (not illustrated), the first area 481 may include an area provided by the second non-conductive structure 800 and an area provided by the second conductive structure 900. The first adhesive member 480 may be located between the periphery of the display 301 (or the display area or the screen) and the periphery of the front plate 201 when viewed from above the front plate 201 (e.g., when viewed in the −z-axis direction), and may not overlap the active area of the display 301. The electronic device 200 (see FIG. 2) may include a first boundary portion B1 in which the periphery of the front plate 201 faces the first side rim portion 905. The first boundary portion B1 may be, for example, a reference by which the front plate 201 and the first side rim portion 905 of the outer surface of the electronic device 200 are distinguished, and may be defined in an annular shape. In an embodiment, the first adhesive member 480 may prevent foreign substances, such as water or dust, introduced from the outside through the gap of the first boundary portion B1, from being introduced into a first space S1 between the front plate 201 and the second surface ② of the first support member 410. For example, even if the electronic device 200 is flooded in water, electrical trouble or malfunction of at least one electronic component, such as the display 301, located in the first space S1 can be suppressed due to waterproofing provided by the first adhesive member 480. In some embodiments, the first adhesive member 480 may be referred to as a first waterproofing area of the housing 210 (see FIG. 2 or 3). In some embodiments, the first boundary portion B1 may be implemented substantially without a gap. For example, the periphery of the front plate 201 may be in contact with the first side rim portion 905. As another example, a liquid or paste-like sealant or adhesive material that can be cured into gasket (e.g., CIPG) may be filled and solidified in the gap of the first boundary portion B1. In some embodiments, the first adhesive member 480 may be expanded into the gap of the first boundary portion B1.

According to an embodiment, the second adhesive member 490 may be located between the rear plate 202 and the first support member 410 to be adjacent to the periphery of the front plate 201. The second adhesive member 490 may be disposed in, for example, a second area 482 included in the third surface ③ of the first support member 410. The second area 482 may be, for example, a partial area of the third surface ③ that is located adjacent to the periphery of the rear plate 202 and faces the rear surface of the rear plate 202 (e.g., the surface opposite to the rear surface 210B). In an embodiment, at least a portion of the second area 482 may be provided by the second non-conductive structure 800 of the first support member 410. In some embodiments (not illustrated), at least a portion of the second area 482 may be provided by the second conductive structure 900 of the first support member 410. In some embodiments (not illustrated), the second area 482 may include an area provided by the second non-conductive structure 800 and an area provided by the second conductive structure 900.

According to an embodiment, the electronic device 200 (see FIG. 2) may include a second boundary portion B2 in which the periphery of the rear plate 202 faces the side member 203. The second boundary portion B2 may be, for example, a reference through which the rear plate 202 and the side member 203 in the outer surface of the electronic device 200 are distinguished, and may be defined in an annular shape. The electronic device 200 may include a third boundary portion B3 in which the first side rim portion 905 faces the side member 203. The third boundary portion B3 may be, for example, a reference through which the first rim portion 905 and the side member 203 in the outer surface of the electronic device 200 are distinguished, and may be defined in an annular shape. In some embodiments, when the front plate 201 is implemented to include a curved portion 907 extending toward the side member 203 to replace the first side rim portion 905, the first boundary portion B1 and the third boundary portion B3 may not exist, and a boundary portion between the front plate 201 and the side member 203 may be provided. In an embodiment, the second adhesive member 490 may prevent foreign substances (e.g., dust or water) F1 introduced from the outside through the gap of the second boundary portion B2 or foreign substances F2 introduced from the outside through the gap of the third boundary portion B3, from being introduced into a second space S2 between the rear plate 202 and the third surface ③ of the first support member 410. For example, when the electronic device 200 is flooded in water, water may be introduced through the gap of the second boundary portion B2 or the gap of the third boundary portion B3. However, due to waterproofing provided by the second adhesive member 490, electrical trouble or malfunction of at least one electronic component (e.g., the first board assembly 440, the second board assembly 450, or the battery 460 illustrated in FIG. 4) located in the second space S2 can be suppressed. In some embodiments, the second adhesive member 490 may be referred to as a second waterproofing area of the housing 210 (see FIG. 2 or 3).

According to an embodiment, the electronic device 200 may include a third space S3 defined by the first support member 410, the side member 203, the rear plate 202, and the second adhesive member 490. The third space S3 may be separated from the first space S1 and the second space S2. The third space S3 may extend from the second boundary B2 to the third boundary portion B3 via the space between the first surface ① (or the first support member 410) and the side member 203. The third space S3 may be in fluidic communication with the external space of the electronic device 200 through the gap of the second boundary portion B2 or the gap of the third boundary portion B3. For example, in a situation such as flooding of the electronic device 200, water may be introduced into the third space S3 through the gap of the second boundary portion B2 or the gap of the third boundary portion B3. The water introduced into the third space S3 may not move into the second space S2 due to the second adhesive member 490 (or the waterproofing area). The water located in the third space S3 may be discharged to the outside of the electronic device 200 through the gap of the second boundary portion B2 or the gap of the third boundary portion B3. In some embodiments, the third space S3 may be referred to as an internal flow space in fluidic communication with the gap of the second boundary portion B2 or the gap of the third boundary portion B3.

According to some embodiments, the second boundary portion B2 may be implemented substantially without a gap. For example, a periphery of the rear plate 202 may be in contact with the side member 203. As another example, a liquid or paste-like sealant or an adhesive material such as a material to be cured through CIPG may be filled and solidified in the gap of the second boundary portion B2. As another example, a flexible member, which is in elastic contact with the rear plate 202 and the side member 203, may be interposed in the gap of the second boundary portion B2. In some embodiments, the second adhesive member 490 may be expanded into the gap of the second boundary portion B2.

According to some embodiments, the third boundary portion B3 may be implemented substantially without a gap. For example, the first side rim portion 905 and the side member 203 may be in contact with each other. As another example, a liquid or paste-like sealant or adhesive material such as a CIPG may be filled and solidified in the gap of the third boundary portion B3. As another example, a flexible member, which is in elastic contact with the rear plate 202 and the side member 203, may be interposed in the gap of the third boundary portion B3.

Figure 11:
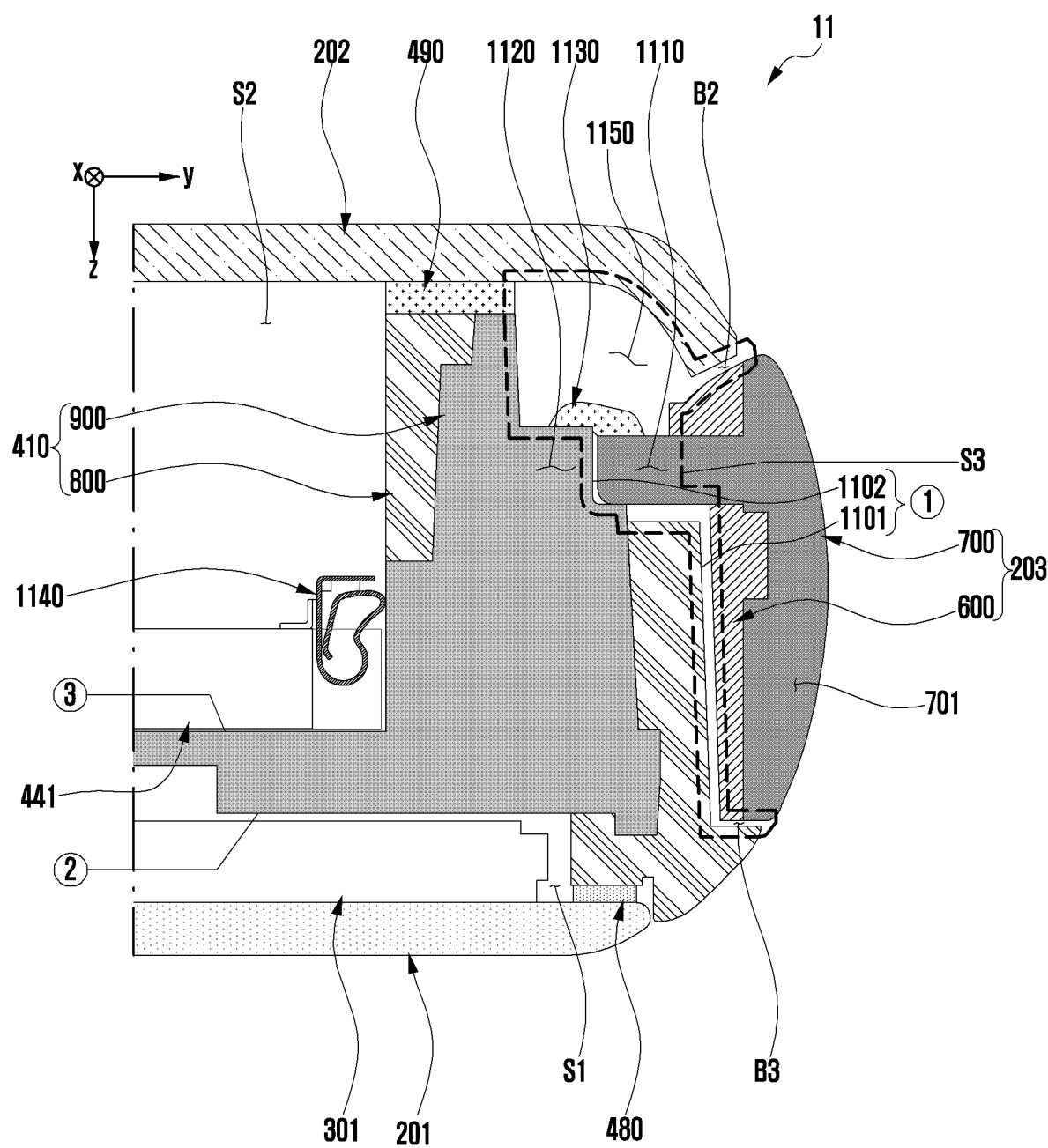
FIG. 11 illustrates a cross-sectional structure in a y-z plane of a portion of the electronic device taken along line C-C' in FIG. 3, in an embodiment.

FIG. 11 illustrates a cross-sectional structure 11 in a y-z plane of a portion of the electronic device 200 taken along line C-C' in FIG. 3, in an embodiment.

FIG. 11 illustrates, for example, the side member 203, the first support member 410, the front plate 201, the rear plate 202, the first adhesive member 480, the second adhesive member 490, the display 301, and/or the flexible conductive member 1140.

Referring to FIG. 11, in an embodiment, the first conductive structure 700 of the side member 203 may include a first portion 1110 extending into the third space S3. The first portion 1110 may be mechanically and electrically connected to the second portion 1120 of the second conductive structure 900 included in the first support member 410. In the illustrated example, at the position at which the first portion 1110 and the second portion 1120 are connected to each other, the first surface ① may include a non-conductive area 1101 provided by the second non-conductive structure 800 and a conductive area 1102 provided by the second conductive structure 900. The first portion 1110 may extend to the first surface ① to be adjacent to or in contact with the conductive area 1102. The first portion 1110 may be one of the plurality of extensions 711, 712, 713, 714, and 715 illustrated in FIG. 5, 6, 7, or 8 that coincide with the line C-C' of FIG. 3. In an embodiment, when the side member 203 is coupled to the first support member 410, the front case 400 (see FIG. 5) may include an opening 1150. The first portion 1110 and the second portion 1120 may be exposed through the opening 1150. In the opening 1150, the first portion 1110 and the second portion 1120 may be mechanically or electrically connected to each other using a conductive adhesive material 1130 such as solder, copper, silver paste, aluminum, silver-aluminum, carbon paste, or CNT paste (e.g., by welding). The conductive adhesive material 1130 may be located in the opening 1150 or the third space S3. The mechanical connection of the first portion 1110 and the second portion 1120 may form an integrated structure in which the side member 203 and the first support member 410 are connected to each other, thereby contributing to durability or rigidity of the front case 400 (see FIG. 8). For example, with respect to external impacts (e.g., impacts due to the drop of the electronic device 200), the mechanical connection between the first portion 1110 and the second portion 1120 may suppress separation of the first conductive structure 700 from the first non-conductive structure 600, or deformation or damage of the first conductive structure 700. Although not illustrated, a cross-sectional structure at another position at which the first conductive structure 700 and the second conductive structure 900 are mechanically and electrically connected may be configured to be substantially the same as or at least partially similar to a cross-section in the y-z plane corresponding to the third side portion 503 (see FIG. 5).

According to some embodiments (not illustrated), the first portion 1110 of the first conductive structure 700 and the second portion 1120 of the second conductive structure 900 may be implemented to overlap each other in the opening 1150 when viewed from above the rear plate 202 (e.g., when viewed in the +z-axis direction). The first portion 1110 and the second portion 1120 may be electrically connected using welding at a position overlapping (or aligned with) the opening 1150. For example, a welding apparatus (not illustrated) applies heat to the first portion 1110 exposed through the opening 1150, and the first portion 1110 and the second portion 1120 may be melted and bonded at the boundary therebetween. In some embodiments, a conductive adhesive material (not illustrated) may be located between the first portion 1110 and the second portion 1120. The conductive adhesive material may include, for example, a thermally responsive conductive adhesive material, and may be melt and bonded with the first portion 1110 and the second portion 1120 during welding. The conductive adhesive material (e.g., solder, copper, silver paste, aluminum, silver-aluminum, carbon paste, or CNT paste) may contribute to increasing the interfacial bonding force of the first portion 1110 and the second portion 1120 between the first portion 1110 and the second portion 1120. The conductive adhesive material may include a metal material having a lower melting point than that of the first portion 1110 and the second portion 1120. In some embodiments, the first portion 1110 and the second portion 1120 may be mechanically and electrically connected to each other using ultrasonic welding. When ultrasonic vibration is applied, the first portion 1110 and the second portion 1120 may be mechanically and electrically connected by frictional heat between the first portion 1110 and the second portion 1120. In this case, in some embodiments, the second non-conductive structure 800 of the first support member 410 may be expanded into the first opening 1150 to cover the first portion 1110, and the opening 1150 may be provided in the form of a smaller space unlike that in the illustrated example or may not be formed substantially.

According to some embodiments, the first portion 1110 of the first conductive structure 700 and the second portion 1120 of the second conductive structure 900 may be mechanically and electrically connected to each other using screw fastening. In some embodiments, a flexible conductive member such as a pogo pin, a spring, conductive Poron, conductive rubber, conductive tape, or a conductive connector may be located between the first portion 1110 and the second portion 1120. For example, the first portion 1110 and the second portion 1120 may overlap each other in the opening 1150 when viewed from above the rear plate 202 (e.g., when viewed in the +z-axis direction) and may be electrically connected to each other using a screw (or a bolt) or a flexible conductive member at a position overlapping (or aligned with) the opening 1150. Depending on the connection structure between the first portion 1110 and the second portion 1120, the shapes or the arrangement structure of the first portion 1110 and the second portion 1120 may vary. According to some embodiments, the first portion 1110 of the first conductive structure 700 may be inserted into a hole or recess provided in the first surface ① of the first support member 410. For example, the first portion 1110 of the first conductive structure 700 may be inserted into a hole or recess provided in the second conductive structure 900.

According to some embodiments, the first portion 1110 of the first conductive structure 700 and the second portion 1120 of the second conductive structure 900 may be electrically connected to each other by simply being in physical contact, and additional electrical connection members such as the conductive adhesive material 1130 are not needed. In this case, the portion (not illustrated) in which the first portion 1110 and the second portion 1120 are in physical contact with each other may include a structure in which the first portion 1110 and the second portion 1120 can be mechanically coupled to each other (e.g., a fitting structure) to contribute to a stable connection.

According to an embodiment, at least a portion of the first conductive structure 700 may be electrically connected to the first printed circuit board 441 located in the second space S2. In an embodiment, the flexible conductive member 1140 may be disposed on the first printed circuit board 441, and may be in elastic contact with the second conductive structure 900 of the first support member 410. The first printed circuit board 441 may be electrically connected to the first conductive structure 700 via the flexible conductive member 1140 and the second conductive structure 900. The flexible conductive member 1140 may include, for example, a conductive clip (e.g., a conductive member including an elastic structure). In some embodiments, the flexible conductive member 1140 may be implemented in various other forms, such as a pogo pin, a spring, conductive Poron, conductive rubber, conductive tape, or a conductive connector.

The electronic device 200 (see FIG. 2) may include, for example, at least one antenna and a wireless communication circuit (e.g., the wireless communication module 192 of FIG. 1) electrically connected to the at least one antenna. The wireless communication circuit may be disposed on the first printed circuit board 441 located in the second space S2. The antenna included in the electronic device 200 may include, for example, at least one antenna radiator, a ground, or a transmission line. The at least one antenna radiator may be electrically connected to the wireless communication circuit to form an electromagnetic field capable of transmitting and/or receiving a signal of at least one frequency in a selected or predetermined frequency band. The at least one antenna radiator may include a conductive pattern located or included in the housing 210 (see FIG. 2) or a conductive pattern located inside the electronic device 200, (e.g., a laser direct structuring (LDS) type, a flexible printed circuit board (FPCB) type, a type implemented by plating or printing, or a microstrip located on the first printed circuit board 441).

The wireless communication circuit may process a transmission signal or a reception signal in at least one predetermined frequency band via the at least one antenna radiator. The predetermined frequency band may include, for example, at least one of a low band (LB) (about 600 MHz to about 1 GHz), a middle band (MB) (about 1 GHz to about 2.3 GHz), a high band (HB) (about 2.3 GHz to about 2.7 GHz), or an ultra-high band (UHB) (about 2.7 GHz to about 6 GHz). The predetermined frequency band may include various other frequency bands. The transmission line may electrically interconnect the wireless communication circuit and the at least one antenna radiator, and may transmit radio frequency (RF) signals (voltage or current). The transmission line may include, for example, various types of conductive structures interconnecting the wireless communication circuit to the at least one antenna radiator, or an electrical path implemented with wiring. The ground (or an antenna ground) may include, for example, a ground (e.g., a ground plane) located on or included in the first printed circuit board 441. The antenna may include a frequency adjustment circuit (e.g., a matching circuit) connected to the transmission line between the at least one antenna radiator and the wireless communication circuit. The frequency adjustment circuit may include an electrical element having a component such as inductance, capacitance, or conductance acting on the transmission line.

According to an embodiment, at least a portion of the first conductive structure 700 may be electrically connected to the wireless communication circuit (e.g., the wireless communication module 192 in FIG. 1) to operate as an antenna radiator. The first conductive structure 700 used as an antenna radiator may be located in an outskirt area of the electronic device 200 (see FIG. 2) to be easily electromagnetically isolated from other conductive portions (or metal portions) of the electronic device 200 that may affect antenna radiation performance. In the illustrated example, the first conductive portion 701 of the first conductive structure 700 may be electrically connected to the wireless communication circuit to generate electromagnetic field capable of transmitting and/or receiving signals of at least one frequency in a selected or predetermined frequency band. The first portion 1110 may operate as a feeding unit (or a feeding terminal) of the antenna radiator for supplying radiation current to the first conductive portion 701 used as an antenna radiator. The wireless communication circuit may provide radiation current (or an electromagnetic signal) to the first conductive portion 701 via the first portion 1110, and the first conductive portion 701 may radiate a fed electromagnetic signal to the outside or receive an electromagnetic signal from the outside. In the illustrated embodiment, the transmission line between the wireless communication circuit and the first conductive portion 701 may include a first electrical path interconnecting the wireless communication circuit and the flexible conductive member 1140, a second electrical path interconnecting the flexible conductive member 1140 and the conductive adhesive material 1130, a conductive adhesive material, and the first conductive portion 701. The first electrical path may include, for example, wiring included in the first printed circuit board 441. The second electrical path may be provided by, for example, a portion of second conductive structure 900 that includes the second portion 1120. In some embodiments (not illustrated), the second conductive structure 900 may be implemented to include a first conductive area providing the second electrical path, and a second conductive area physically separated from the first conductive area.

According to an embodiment, the second conductive structure 900 may be electrically connected to a ground (e.g., a ground plane or a ground layer) included in the first printed circuit board 441. For example, between the second conductive structure 900 and one surface of the first printed circuit board 441 (e.g., the surface facing the rear plate 202), a flexible conductive member (e.g., a conductive clip, a pogo pin, a spring, conductive Poron, conductive rubber, conductive tape, or a conductive connector) or a conductive adhesive material may be located. The second conductive structure 900 may be electrically connected to the ground (e.g., ground plane or ground layer) included in the second printed circuit board 451 (see FIG. 4) in substantially the same or similar manner as the first conductive structure 700. At least a portion of the second conductive structure 900 electrically connected to the ground may serve as an electromagnetic shielding structure (or a ground structure) for reducing electromagnetic influence (e.g., electromagnetic interference (EMI)) on components included in the electronic device 200 (FIG. 2). At least a portion of the second conductive structure 900 may reduce the influence of, for example, electromagnetic noise (e.g., EMI) generated inside the electronic device 200 or introduced from the outside of the electronic device 200, on the first printed circuit board 441, the second printed circuit board 451 (see FIG. 4), and/or the display 301. At least a portion of the second conductive structure 900 may reduce electromagnetic interference between, for example, the first printed circuit board 441 and the display 301.

According to an embodiment, at least a portion of the first conductive structure 700 may be electrically connected to the ground included in the first printed circuit board 441 via the second conductive structure 900. In an embodiment, some of the plurality of extensions 711, 712, 713, 714, and 715 illustrated in FIG. 5, 6, 7, or 8 may be electrically connected to the second conductive structure 900, as ground terminals, in the substantially the same manner as the electrical connection structure between the first portion 1110 and the second portion 1120. In the illustrated example, referring to the wireless communication circuit and the first conductive portion 701 electrically connected to the ground, when the wireless communication circuit supplies radiation current to the first conductive portion 701, the first conductive portion 701 may form a signal path between the feeding unit (e.g., the first portion 1110) and the ground. The second conductive portion 702, the third conductive portion 703, the fourth conductive portion 704, or the fifth conductive portion 705 illustrated in FIG. 6 may be electrically connected to the wireless communication circuit (e.g., the wireless communication module 192 in FIG. 1) and the ground in substantially the same manner as the first conductive portion 701 to operate as an antenna radiator.

According to some embodiments, a coating material may be additionally provided to suppress contamination or corrosion of the portion of the first conductive structure 700 exposed to the third space S3, the portion of the second conductive structure 900 exposed to the third space S3, or the conductive adhesive material 1130, due to foreign substances such as water introduced into the third space S3. For example, liquid or paste-like sealant or adhesive material, such as a CIPG, may be filled and solidified in the opening 1150. As another example, a flexible member, such as rubber, may elastically fitted into the opening 1150. The suppression of contamination or corrosion by the coating material may contribute to reliable connection or antenna radiation performance. In some embodiments, the second non-conductive structure 800 may be expanded in a manner different from that in the illustrated example to reduce an area of the second conductive structure 900 that is exposed to the third space S3.

According to some embodiments, a coating layer (not illustrated) may be provided on the surface of the first conductive structure 700. In some embodiments, a coating layer may be provided in an area of the first conductive structure 700 that is not covered by the first non-conductive structure 600. The coating layer may increase surface strength, suppress contamination or corrosion of the first conductive structure 700, or improve the aesthetics of the first conductive structure 700. The coating layer may be formed using, for example, plating. As another example, the coating layer may include an oxide layer of a non-conductive material formed using anodic oxidation or anodizing. In an embodiment, the first portion 1110 may not include an oxide layer, or, in the oxide layer included in the first portion 1110, a portion corresponding to an area for electrical connection with the conductive adhesive material 1130 may be removed.

According to some embodiments, an oxide layer of a non-conductive material may be formed on the surface of an area of the second conductive structure 900 that is not covered by the second non-conductive structure 800 using anodic oxidation or anodizing. The oxide layer of the non-conductive material is a coating layer for protecting the second conductive structure 900 from external factors, and may increase, for example, surface strength or suppress corrosion of the second conductive structure 900. The area of the second conductive structure 900 for electrical connection with the first conductive structure 700, the first printed circuit board 441, or the second printed circuit board 451 (see FIG. 4) may not include an oxide layer, or a portion of the oxide layer corresponding to the area may be removed. In some embodiments, when the second conductive structure 900 is surface-treated using anodizing, the second non-conductive structure 800 may include a material that is not substantially affected by anodizing. For example, the second non-conductive structure 800 may include a heat-resistant and acid-resistant polymer for anodizing. In some embodiments, the surface of the second non-conductive structure 800 may be coated using a paint, and the paint may be heat-resistant and acid-resistant so as not to be substantially affected during anodizing.

According to some embodiments, an organic adhesive layer (e.g., TRI bonding) may be interposed between the second non-conductive structure 800 and the second conductive structure 900. The organic adhesive layer may contribute to the bonding strength and waterproofing between the second non-conductive structure 800 and the second conductive structure 900.

Figure 12:
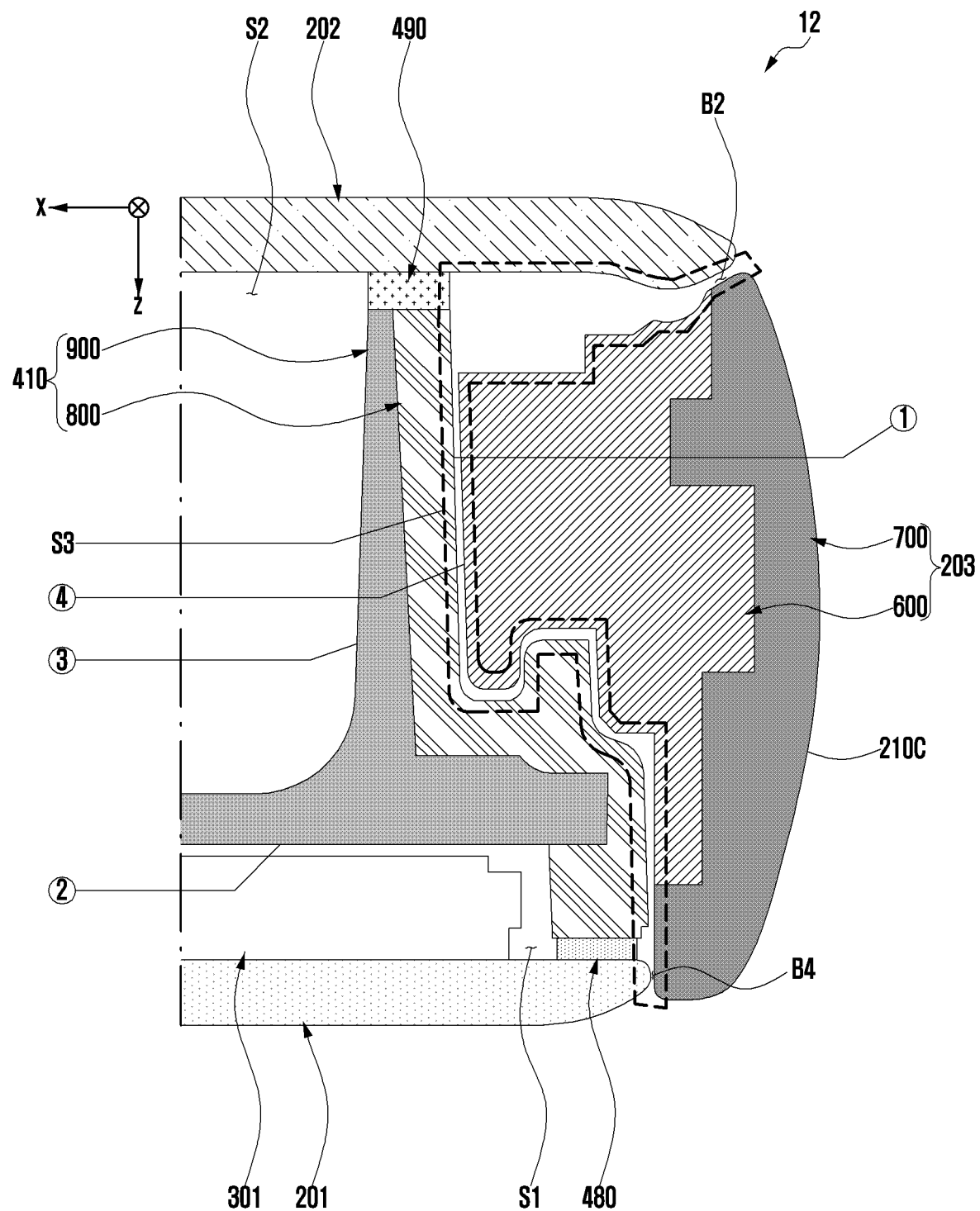
FIG. 12 illustrates a cross-sectional structure in an x-z plane of a portion of the electronic device taken along line B-B' in FIG. 3, in another embodiment.
Figure 13:
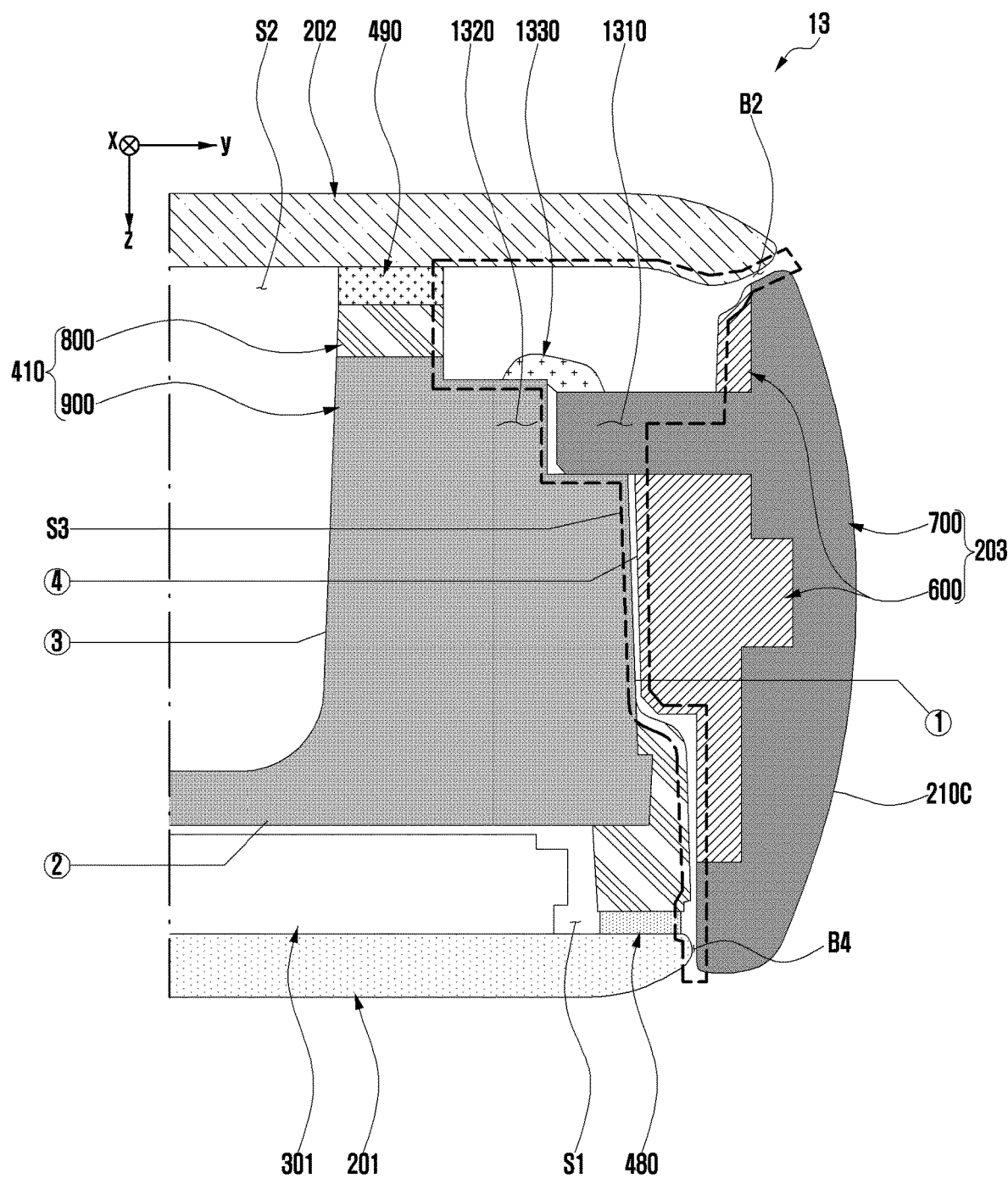
FIG. 13 illustrates a cross-sectional structure in a y-z plane of a portion of the electronic device taken along line C-C' in FIG. 3, in another embodiment.

FIG. 12 illustrates a cross-sectional structure 12 in an x-z plane of a portion of the electronic device 200 taken along line B-B' in FIG. 3, in another embodiment. FIG. 13 illustrates a cross-sectional structure 13 in a y-z plane of a portion of the electronic device 200 taken along line C-C' in FIG. 3, in another embodiment.

FIGS. 12 and 13 illustrate the side member 203, the first support member 410, the front plate 201, the rear plate 202, the first adhesive member 480, the second adhesive member 490, the display 301, and the conductive adhesive material 1330 (e.g., the conductive adhesive material 1130 in FIG. 11). The side member 203 may include a first non-conductive structure 600 and a first conductive structure 700. The first support member 410 may include a second non-conductive structure 800 and a second conductive structure 900. The side member 203 may include the side surface 210C and the fourth surface ④ of the electronic device 200. The first support member 410 may include the first surface ① of the front case 400 (see FIG. 8). The first support member 410 may define the second surface ② located to correspond to the front plate 201. The second surface ② may be located to be separated from the first surface ① with respect to the first adhesive member 480. The first support member 410 may include the third side ③ located to correspond to the rear plate 202. The third surface ③ may be located to be separated from the first surface ① with reference to the second adhesive member 490. FIG. 12 illustrates another embodiment which may be modified from the embodiment of FIG. 10, and FIG. 13 illustrates another embodiment which may be modified from the embodiment of FIG. 11. One or more components indicated by the same reference numerals as those of FIG. 10 or 11 may be made in at least partially similar to or the same manner as those of FIG. 10 or 11 even though the components may be different from those of FIG. 10 or 11 in shape. In an embodiment, the first side rim portion 905 according to the embodiment of FIG. 10 may be omitted, and the side member 203 may be expanded to replace the first side rim portion 905. The electronic device 200 (see FIG. 2) may include a fourth boundary portion B4 in which the periphery of the front plate 201 faces the side member 203. The fourth boundary portion B4 may be, for example, a reference through which the front plate 201 and the side member 203 in the outer surface of the electronic device 200 are distinguished, and may be formed in an annular shape. In an embodiment, the fourth boundary portion B4 may refer to the space between the periphery of the front plate 201 and the first conductive structure 700 of the side member 203. The first adhesive member 480 may prevent foreign substances, such as water or dust, introduced from the outside through the gap of the fourth boundary portion B4, from being introduced into the first space S1 between the front plate 201 and the second surface ② of the first support member 410. The second adhesive member 490 may prevent foreign substances, such as water or dust, introduced from the outside through the gap of the second boundary portion B2 (e.g., between the periphery of the rear plate 202 and the side member 203), from being introduced into the second space S2 between the rear plate 202 and the third surface ③ of the first support member 410.

According to an embodiment, the first non-conductive structure 600 of the side member 203 may be located inside the electronic device 200 and may not be exposed to the outside of the electronic device 200. In some embodiments (not illustrated), in place of the first side rim portion 905 of FIG. 10, the first non-conductive structure 600 of the side member 203 may be implemented to extend to the space between the first conductive structure 700 and the front plate 201 to define a portion of the side surface 210C. In some embodiments (not illustrated), the first non-conductive structure 600 of the side member 203 may be implemented to extend to the space between the first conductive structure 700 and the rear plate 202 and to define a portion of the side surface 210C (e.g., the second side rim portion).

According to an embodiment, the electronic device 200 (see FIG. 2) may include a third space S3 defined by the first support member 410, the side member 203, the rear plate 202, the first adhesive member 480, and the second adhesive member 490. The third space S3 may be separated from the first space S1 and the second space S2. The third space S3 may extend from the second boundary portion B2 to the fourth boundary portion B4 via the space between the first surface ① and the side member 203. The third space S3 may be in fluidic communication with the external space of the electronic device 200 through the gap of the second boundary portion B2 or the gap of the fourth boundary portion B4. For example, in a situation such as flooding of the electronic device 200, water may be introduced into the third space S3 through the gap of the second boundary portion B2 or the gap of the fourth boundary portion B4. The water introduced into the third space S3 may not flow into the first space S1 due to the first adhesive member 480. The water introduced into the third space S3 may not flow into the second space S2 due to the second adhesive member 490. The water located in the third space S3 may be discharged to the outside through the gap of the second boundary portion B2 or the gap of the fourth boundary portion B4. In some embodiments, the third space S3 may be referred to as an internal flow space in fluidic communication with the gap of the second boundary portion B2 or the gap of the third boundary portion B3.

According to an embodiment, the first conductive structure 700 of the side member 203 may include a first portion 1310 (e.g., the first portion 1110 in FIG. 11) extending into the third space S3. The first portion 1310 of the first conductive structure 700 may be mechanically and electrically connected to the second portion 1320 (e.g., the second portion 1120 in FIG. 11) of the second conductive structure 900 included in the first support member 410 using a conductive adhesive material 1330 (e.g., the conductive adhesive material 1130 in FIG. 11). According to some embodiments, the first portion 1310 of the first conductive structure 700 and the second portion 1320 of the second conductive structure 900 may be mechanically and electrically connected to each other using various other methods such as screw fastening. In some embodiments, the first portion 1310 of the first conductive structure 700 and the second portion 1320 of the second conductive structure 900 may be electrically connected to each other by being in physical contact with each other without an electrical connection member such as the conductive adhesive material 1330. In some embodiments, a flexible conductive member (e.g., a conductive clip, a pogo pin, spring, conductive Poron, conductive rubber, conductive tape, or a conductive connector) may be located between the first conductive structure 700 and the second conductive structure 900, and the first conductive structure 700 and the second conductive structure 900 may be electrically connected to each other via a flexible conductive member.

Figure 14:
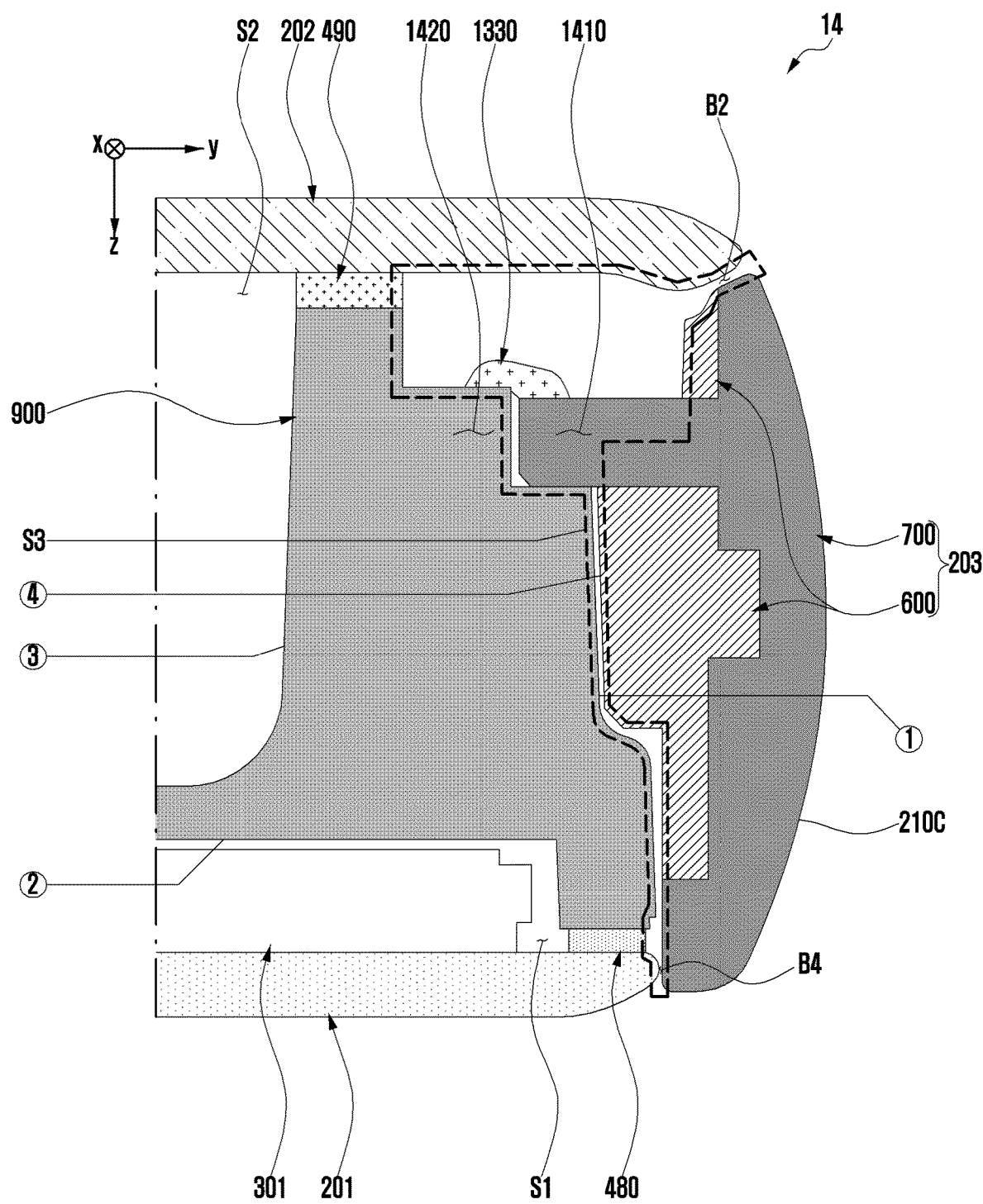
FIG. 14 illustrates a cross-sectional structure in a y-z plane of a portion of the electronic device taken along line C-C' in FIG. 3, in another embodiment.

FIG. 14 illustrates a cross-sectional structure 13 in a y-z plane of a portion of the electronic device 200 taken along line C-C' in FIG. 3, in another embodiment.

FIG. 14 illustrates another embodiment which may be modified from the embodiment of FIG. 13. One or more components indicated by the same reference numerals as those of FIG. 13 may be made in at least partially similar to or the same manner as those of FIG. 13 even though the components may be different from those of FIG. 13 in shape. In an embodiment, the second connection structure 402 of FIG. 8 may be provided by the second conductive structure 900. The first surface ① may be defined by the second conductive structure 900. The third space S3 may be defined by the second conductive structure 900, the side member 203, the rear plate 202, the first adhesive member 480, and the second adhesive member 490. The third space S3 may extend from the second boundary portion B2 to the fourth boundary portion B4 via the space between the first surface ① and the side member 203.

Figure 15:
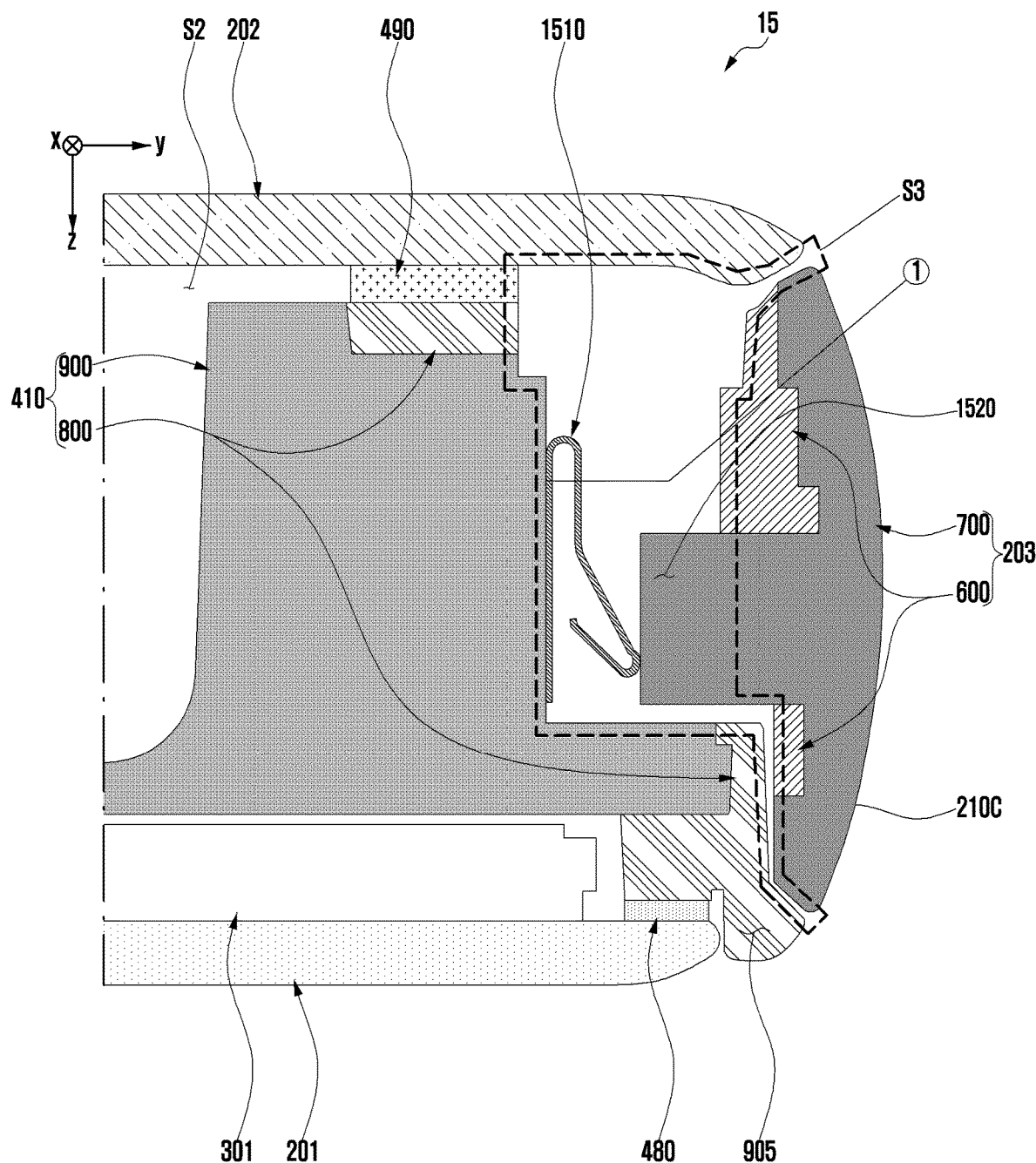
FIG. 15 illustrates a cross-sectional structure in a y-z plane of a portion of the electronic device taken along line C-C' in FIG. 3, in another embodiment.
Figure 16:
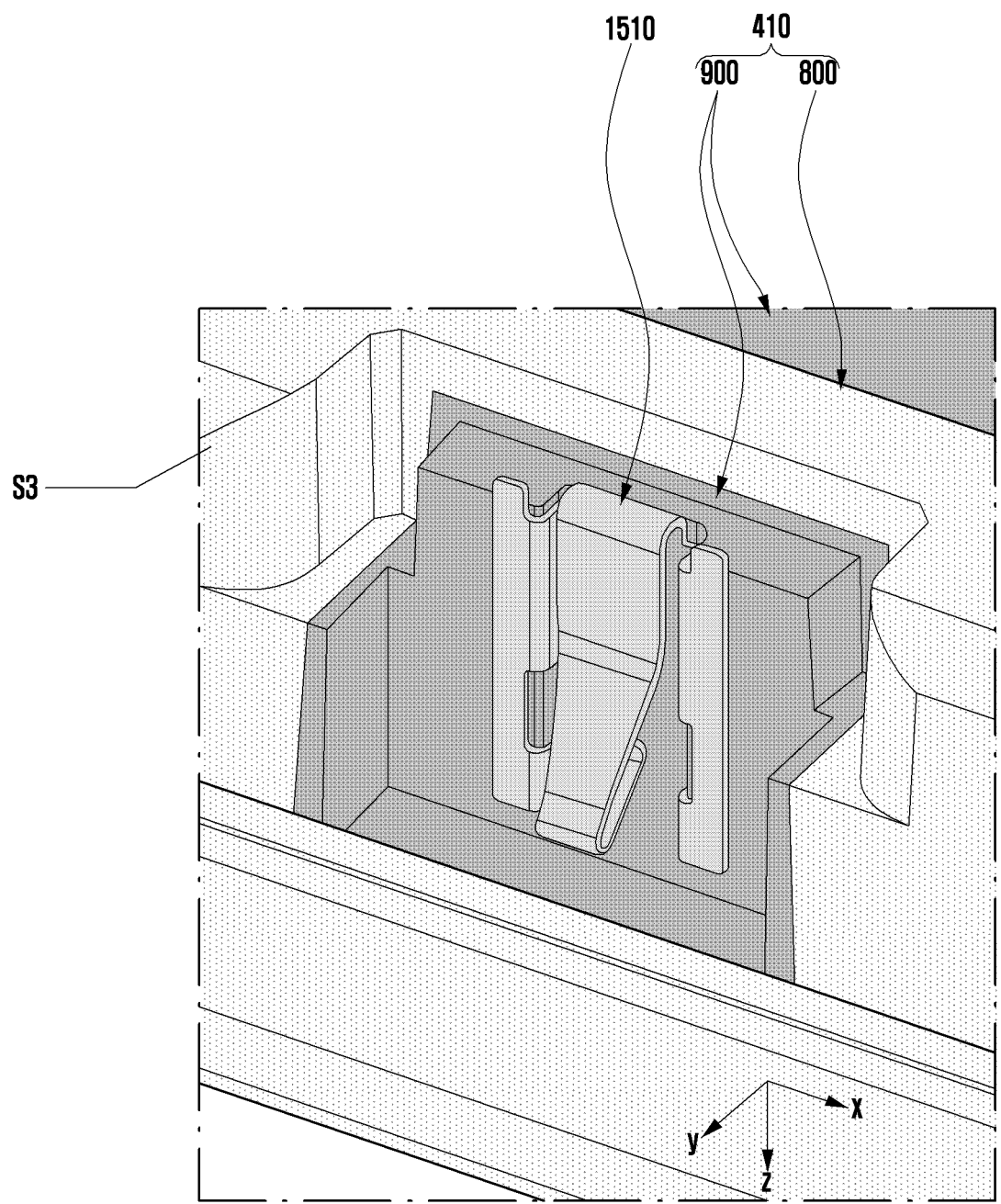
FIG. 16 illustrates a first support member and a flexible conductive member, with respect to the embodiment of FIG. 15.
Figure 17:
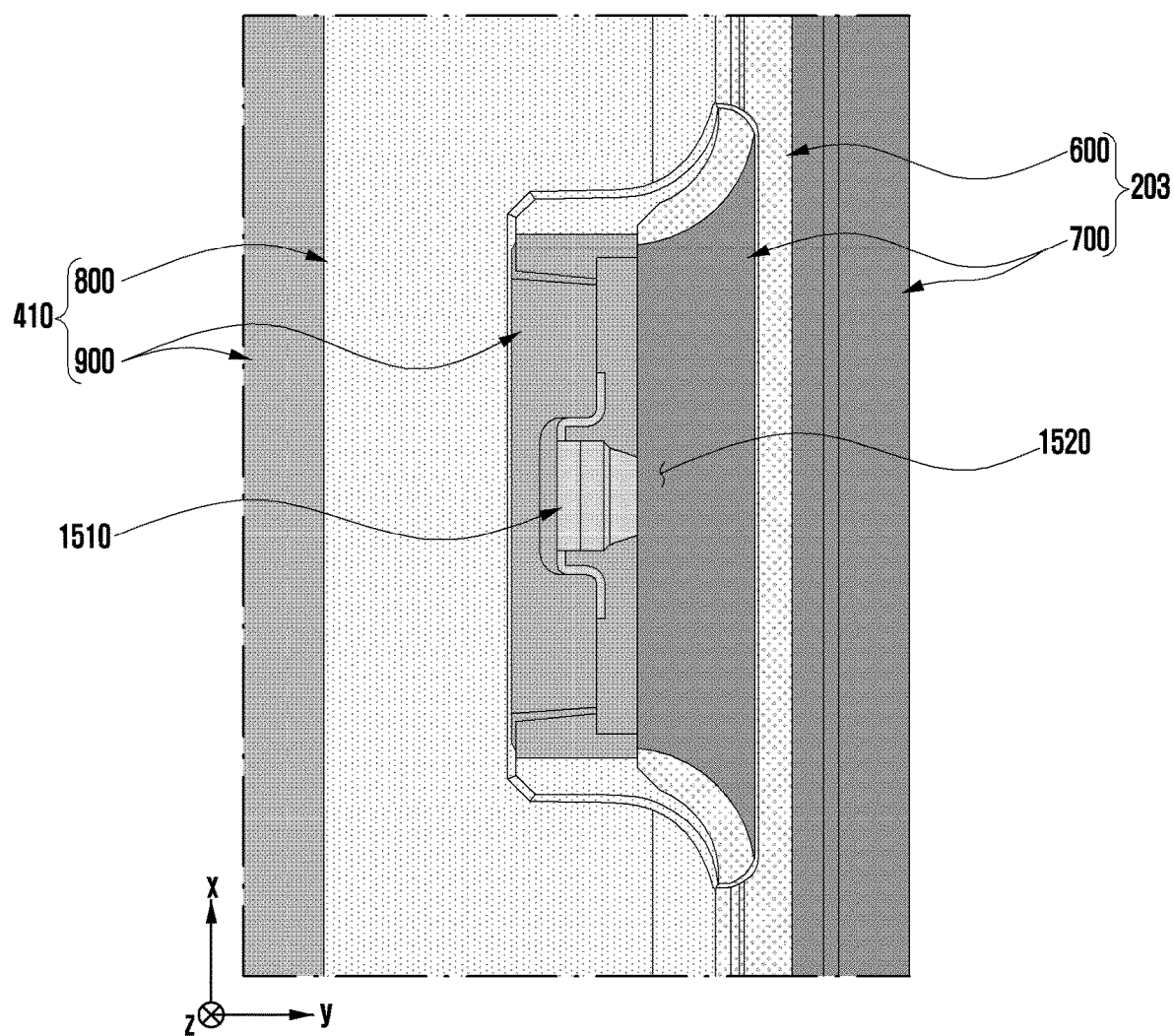
FIG. 17 is an x-y plan view of a state in which a first support member, a side member, and a flexible conductive member are coupled with respect to the embodiment of FIG. 15.

FIG. 15 illustrates a cross-sectional structure 15 in a y-z plane of a portion of the electronic device 200 taken along line C-C' in FIG. 3, in another embodiment. FIG. 16 illustrates the first support member 410 and the flexible conductive member 1510, with respect to the embodiment of FIG. 15. FIG. 17 is an x-y plan view of a state in which the first support member 410, the side member 203, and the flexible conductive member 1510 are coupled with respect to the embodiment of FIG. 15.

FIG. 15 illustrates another embodiment which may be modified from the embodiment of FIG. 11. One or more components indicated by the same reference numerals as those of FIG. 11 may be made in at least partially similar to or the same manner as those of FIG. 11 even though the components may be different from those of FIG. 11 in shape. Referring to FIGS. 15, 16, and 17, in an embodiment, the flexible conductive member 1510 may be located between the first conductive structure 700 of the side member 203 and the second conductive structure 900 of the first support member 410. The first conductive structure 700 of the side member 203 and the second conductive structure 900 of the first support member 410 may be electrically connected to each other via the flexible conductive member 1510. The flexible conductive member 1510 may include, for example, a conductive clip (e.g., a conductive member including an elastic structure), and may be disposed on the first surface ①. The flexible conductive member 1510 may be located in the third space S3. Between the first surface ① and the flexible conductive member 1510, a conductive material (not illustrated) such as solder, copper, silver paste, aluminum, silver-aluminum, carbon paste, or CNT paste may be located. In an embodiment, the first conductive structure 700 of the side member 203 may include a portion extending to the third space S3 to come into elastic contact with the elastic conductive member 1510 (e.g., one of the plurality of first extensions 711 in FIG. 8 that coincide with the line C-C' of FIG. 3 or the first portion 1110 in FIG. 11). In some embodiments, the flexible conductive member 1510 may be disposed on the first conductive structure 700 of the side member 203. In some embodiments, the flexible conductive member 1510 may be implemented in various other forms, such as a pogo pin, a spring, conductive Poron, conductive rubber, conductive tape, or a conductive connector.

According to an embodiment of the disclosure, an electronic device (e.g., the electronic device 200 in FIG. 2) may include a front plate (e.g., the front plate 201 in FIG. 9). The electronic device may include a rear plate (e.g., the rear plate 202 in FIG. 9) located opposite to the front plate. The electronic device may include a side member (e.g., the side member 203 in FIG. 9) that at least partially surrounds the internal space between the front plate and the rear plate. The electronic device may include a support member (e.g., the first support member 410 of FIG. 9) located in the internal space and coupled to the side member. The electronic device may include a display (e.g., the display 301 in FIG. 9) located between the front plate and the support member. At least a portion of the display may be visible through the front plate. The electronic device may include a first adhesive member (e.g., the first adhesive member 480 in FIG. 9) located between the front plate and the support member to be adjacent to a periphery of the front plate. The electronic device may include a second adhesive member (e.g., the second adhesive member 490 in FIG. 9) located between the rear plate and the support member to be adjacent to the periphery of the rear plate. The support member may include a first surface (e.g., the first surface ① in FIG. 9) coupled to the side member. The support member may include a second surface (e.g., the second surface ② in FIG. 9) on which the display is disposed, and the second surface may be separated from the first surface with the first adhesive member interposed therebetween. The support member may include a third surface (e.g., the third surface ③ in FIG. 9) located opposite to the second surface, and the third surface may be separated from the first surface with the second adhesive member interposed therebetween.

According to an embodiment of the disclosure, the support member (e.g., the first support member 410 in FIG. 9) may include a portion (e.g., the first side rim portion 905 in FIG. 9) extending to a space between the first plate (e.g., the front plate 201 in FIG. 9) and the side member (e.g., the side member 203 in FIG. 9) and defining a portion of the side surface (e.g., the side surface 210C in FIG. 9) of the electronic device.

According to an embodiment of the disclosure, the outer surface of the electronic device (e.g., the electronic device 200 of FIG. 2) may include a first boundary portion (e.g., the first boundary portion B1 in FIG. 9) between the front plate (e.g., the front plate 201 in FIG. 9) and the support member (e.g., the first support member 410 in FIG. 9). The outer surface of the electronic device may include a second boundary portion (e.g., the second boundary portion B2 in FIG. 9) between the rear plate (e.g., the rear plate 202 in FIG. 9) and the side member (e.g., the side member 203 in FIG. 9). The outer surface of the electronic device may include a third boundary portion (e.g., the third boundary portion B3 in FIG. 9) between the side member and the support member. The internal space of the electronic device may include a first space (e.g., the first space S1 in FIG. 9) between the front plate and the second surface (e.g., the second surface ② in FIG. 9). The internal space of the electronic device may include a second space (e.g., the second space S2 in FIG. 9) between the rear plate and the third surface (e.g., the third surface ③ in FIG. 9). The internal space of the electronic device may include a third space (e.g., the third space ③ in FIG. 9) separated from the first space and the second space. The third space may extend from the second boundary portion to the third boundary portion via the space between the first surface and the side member.

According to an embodiment of the disclosure, the portion (e.g., the first side rim portion 905 in FIG. 9) of the support member (e.g., the first supporting member 410 in FIG. 9) that defines the portion of the side surface of the electronic device may include a non-metal material.

According to an embodiment of the disclosure, the portion (e.g., the first side rim portion 905 in FIG. 9) of the support member (e.g., the first supporting member 410 in FIG. 9) that defines the portion of the side surface of the electronic device may include a metal material.

According to an embodiment of the disclosure, the side member (e.g., the side member 203 in FIG. 8) may include a first non-conductive structure (e.g., the first non-conductive structure 600 in FIG. 8) and a first conductive structure (e.g., the first conductive structure 700 in FIG. 8). The first non-conductive structure may be detachably coupled to the first surface, and may be formed in an annular shape along the first surface. The first conductive structure may be disposed on the first non-conductive structure and may define at least a portion of the side surface of the electronic device.

According to an embodiment of the disclosure, the electronic device (e.g., the electronic device 200 in FIG. 2) may further include a wireless communication circuit (e.g., the wireless communication module 192 in FIG. 1) configured to transmit and/or receive a signal having a selected or predetermined frequency band via at least a portion of the first conductive structure (e.g., the first conductive structure 700 in FIG. 8).

According to an embodiment of the disclosure, the first conductive structure (e.g., the first conductive structure 700 in FIG. 6) may include a plurality of conductive portions (e.g., the plurality of conductive portions 701, 702, 703, 704, and 705 in FIG. 6) disposed on the first non-conductive structure (e.g., the first non-conductive structure 600 in FIG. 6) along the side surface (e.g., the side surface 210C in FIG. 2) of the electronic device. The plurality of conductive portions may define a portion of the side surface of the electronic device. The first non-conductive structure may include a plurality of insulating portions (e.g., the plurality of insulating portions 611, 612, 613, 614, and 615 in FIG. 8). Each of the plurality of insulating portions may be inserted between two of the plurality of conductive portions, and may define a portion of the side surface of the electronic device.

According to an embodiment of the disclosure, the support member (e.g., the first support member 410 in FIG. 6) may include a second non-conducive structure (e.g., the second non-conductive structure 800 in FIG. 6) defining at least a portion of the first surface (e.g., the first surface ① in FIG. 6). The support member may include a second conductive structure (e.g., the second conductive structure 900 in FIG. 6) coupled to the second non-conductive structure.

According to an embodiment of the disclosure, the first conductive structure (e.g., the first conductive structure 700 in FIG. 11) and the second conductive structure (e.g., the second conductive structure 900 in FIG. 11) may be connected to each other.

According to an embodiment of the disclosure, the electronic device (e.g., the electronic device 200 in FIG. 2) may further include a wireless communication circuit (e.g., the wireless communication module 192 in FIG. 1) configured to transmit and/or receive a signal having a selected or predetermined frequency band via at least a portion of the first conductive structure (e.g., the first conductive structure 700 in FIG. 6). The wireless communication circuit may be located between the third surface (e.g., the third surface ③ in FIG. 11) and the rear plate (e.g., the rear plate 202 in FIG. 11). The wireless communication circuit may be electrically connected to at least a portion of the first conductive structure via the second conductive structure (e.g., the second conductive structure 900 in FIG. 11).

According to an embodiment of the disclosure, the first conductive structure (e.g., the first conductive structure 700 in FIG. 11) may include a plurality of extensions (e.g., the plurality of extensions 711, 712, 713, 714, and 715 in FIG. 6) extending towards the first surface (e.g., the first surface ① in FIG. 11) and mechanically and electrically connected to the second conductive structure (e.g., the second conductive structure 900 in FIG. 11).

According to an embodiment of the disclosure, the plurality of extensions (e.g., the plurality of extensions 711, 712, 713, 714, and 715 in FIG. 6) may be mechanically and electrically connected to the second conductive structure (e.g., the second conductive structure 900 in FIG. 6) using a conductive adhesive material (e.g., the conductive adhesive material 1130 in FIG. 11).

According to an embodiment of the disclosure, the plurality of extensions (e.g., the plurality of extensions 711, 712, 713, 714, and 715 in FIG. 6) may be mechanically and electrically connected to the second conductive structure (e.g., the second conductive structure 900 in FIG. 6) using one or more screws.

According to an embodiment of the disclosure, the side member (e.g., the side member 203 in FIG. 8) may be separably coupled to the first surface (e.g., the first surface ① in FIG. 8) using a fastening structure including a hook (e.g., a plurality of hooks H in FIG. 8).

According to an embodiment of the disclosure, an electronic device (e.g., the electronic device 200 in FIG. 2) may include a front plate (e.g., the front plate 201 in FIG. 9). The electronic device may include a rear plate (e.g., the rear plate 202 in FIG. 9) located opposite to the front plate. The electronic device may include a side member (e.g., the side member 203 in FIG. 9) that at least partially surrounds the internal space between the front plate and the rear plate. The electronic device may include a support member (e.g., the first support member 410 of FIG. 9) located in the internal space and coupled to the side member. The electronic device may include a display (e.g., the display 301 in FIG. 9) located between the front plate and the support member. At least a portion of the display may be visible through the front plate. The electronic device may include a first adhesive member (e.g., the first adhesive member 480 in FIG. 9) located between the front plate and the support member to be adjacent to a periphery of the front plate. The electronic device may include a second adhesive member (e.g., the second adhesive member 490 in FIG. 9) located between the rear plate and the support member to be adjacent to the periphery of the rear plate. The support member may include a first surface (e.g., the first surface ① in FIG. 9) coupled to the side member. The support member may include a second surface (e.g., the second surface ② in FIG. 9) on which the display is disposed, and the second surface may be separated from the first surface with the first adhesive member interposed therebetween. The support member may include a third surface (e.g., the third surface ③ in FIG. 9) located opposite to the second surface, and the third surface may be separated from the first surface with the second adhesive member interposed therebetween. The support member may include a portion (e.g., the first side rim portion 905 in FIG. 9) extending to a space between the front plate and the side member to define a portion of the side surface (e.g., the side surface 210C in FIG. 9) of the electronic device. The outer surface of the electronic device may include a first boundary portion (e.g., the first boundary portion B1 in FIG. 9) between the front plate and the support member. The outer surface of the electronic device may include a second boundary portion (e.g., the second boundary portion B2 in FIG. 9) between the rear plate and the side member. The outer surface of the electronic device may include a third boundary portion (e.g., the third boundary portion B3 in FIG. 9) between the side member and the support member. The internal space of the electronic device may include a first space (e.g., the first space S1 in FIG. 9) between the front plate and the second surface. The internal space of the electronic device may include a second space (e.g., the second space S2 in FIG. 9) between the rear plate and the third surface. The internal space of the electronic device may include a third space (e.g., the third space ③ in FIG. 9) separated from the first space and the second space. The third space may extend from the second boundary portion to the third boundary portion via the space between the first surface and the side member.

According to an embodiment of the disclosure, the side member (e.g., the side member 203 in FIG. 8) may include a first non-conductive structure (e.g., the first non-conductive structure 600 in FIG. 8) and a first conductive structure (e.g., the first conductive structure 700 in FIG. 8). The first non-conductive structure may be detachably coupled to the first surface, and may be formed in an annular shape along the first surface. The first conductive structure may be disposed on the first non-conductive structure and may define at least a portion of the side surface of the electronic device. The support member (e.g., the first support member 410 in FIG. 6) may include a second non-conducive structure (e.g., the second non-conductive structure 800 in FIG. 6) defining at least a portion of the first surface (e.g., the first surface ① in FIG. 6). The support member may include a second conductive structure (e.g., the second conductive structure 900 in FIG. 6) coupled to the second non-conductive structure.

According to an embodiment of the disclosure, the electronic device (e.g., the electronic device 200 in FIG. 2) may further include a wireless communication circuit (e.g., the wireless communication module 192 in FIG. 1) configured to transmit and/or receive a signal having a selected or predetermined frequency band via at least a portion of the first conductive structure (e.g., the first conductive structure 700 in FIG. 8).

According to an embodiment of the disclosure, the first conductive structure (e.g., the first conductive structure 700 in FIG. 11) may include a plurality of extensions (e.g., the plurality of extensions 711, 712, 713, 714, and 715 in FIG. 6) extending towards the first surface (e.g., the first surface ① in FIG. 11) and mechanically and electrically connected to the second conductive structure (e.g., the second conductive structure 900 in FIG. 11).

According to an embodiment of the disclosure, the plurality of extensions (e.g., the plurality of extensions 711, 712, 713, 714, and 715 in FIG. 6) may be mechanically and electrically connected to the second conductive structure (e.g., the second conductive structure 900 in FIG. 6) using a conductive adhesive material (e.g., the conductive adhesive material 1130 in FIG. 11).

Embodiments disclosed in this document and drawings are merely presented as specific examples to easily describe a technical content and help understanding of the embodiments, and are not intended to limit the scope of the embodiments. Accordingly, the scope of the various embodiments of the disclosure should be construed as including the embodiments disclosed herein as well as modifications of the embodiments.

The invention claimed is:

1. An electronic device comprising:
a front plate;
a rear plate located opposite to the front plate;
a side member surrounding at least a portion of an internal space between the front plate and the rear plate;
a support member located in the internal space and coupled to the side member;
a display located between the front plate and the support member, at least a portion of the display being visible through the front plate;
a first adhesive member located between the front plate and the support member to be adjacent to a periphery of the front plate; and
a second adhesive member located between the rear plate and the support member to be adjacent to a periphery of the rear plate,
wherein the support member includes:
a first surface coupled to the side member;
a second surface on which the display is disposed and separated from the first surface with a third surface interposed therebetween, the third surface having the first adhesive member disposed thereon; and a fourth surface located opposite to the second surface and separated from the first surface with the second adhesive member interposed therebetween.

2. The electronic device of claim 1, wherein the support member includes a portion extending between the front plate and the side member to define a portion of a side surface of the electronic device.

3. The electronic device of claim 2, wherein an outer surface of the electronic device includes a first boundary portion between the front plate and the support member, a second boundary portion between the rear plate and the side member, and a third boundary portion between the side member and the support member, and
wherein the internal space of the electronic device includes a first space between the front plate and the second surface, a second space between the rear plate and the fourth surface, and a third space separated from the first space and the second space and extending from the second boundary portion to the third boundary portion via a space between the first surface and the side member.

4. The electronic device of claim 2, wherein the portion of the support member that defines the portion of the side surface of the electronic device includes a non-metal material.

5. The electronic device of claim 2, wherein the portion of the support member that defines the portion of the side surface of the electronic device includes a metal material.

6. The electronic device of claim 1, wherein the side member further comprises:
a first non-conductive structure detachably coupled to the first surface and configured in an annular shape along the first surface; and
a first conductive structure disposed on the first non-conductive structure and defining at least a portion of a side surface of the electronic device.

7. The electronic device of claim 6, further comprising:
a wireless communication circuit configured to transmit and/or receive a signal in a selected or predetermined frequency band via at least a portion of the first conductive structure.

8. The electronic device of claim 6, wherein the first conductive structure includes a plurality of conductive portions disposed on the first non-conductive structure along the side surface of the electronic device and defining the portion of the side surface of the electronic device, and
wherein the first non-conductive structure includes a plurality of insulating portions each inserted between two of the plurality of conductive portions and defining the portion of the side surface of the electronic device.

9. The electronic device of claim 6, wherein the support member further comprises:
a second non-conductive structure defining at least a portion of the first surface; and
a second conductive structure coupled with the second non-conductive structure.

10. The electronic device of claim 9, wherein the first conductive structure and the second conductive structure are connected to each other.

11. The electronic device of claim 10, further comprising:
a wireless communication circuit configured to transmit and/or receive a signal in a selected or predetermined frequency band via at least a portion of the first conductive structure, the wireless communication circuit being located between the fourth surface and the rear plate,
wherein the wireless communication circuit is electrically connected to at least a portion of the first conductive structure via the second conductive structure.

12. The electronic device of claim 10, wherein the first conductive structure further comprises a plurality of extensions extending towards the first surface and mechanically and electrically connected to the second conductive structure.

13. The electronic device of claim 12, wherein the plurality of extensions are mechanically and electrically connected to the second conductive structure using a conductive adhesive material.

14. The electronic device of claim 12, wherein the plurality of extensions are mechanically and electrically connected to the second conductive structure using one or more screws.

15. The electronic device of claim 1, wherein the side member is detachably coupled to the first surface using a fastening structure including a hook.

16. The electronic device of claim 1, further comprising:
a first opening between a first side of the side member and the rear plate;
a second opening between a second side opposite to the first side of the side member the support member; and
a passage connecting the first opening with the second opening.

17. An electronic device comprising:
a front plate;
a rear plate located opposite to the front plate;
a side member surrounding at least a portion of an internal space between the front plate and the rear plate;
a support member located in the internal space and coupled to the side member;
a display located between the front plate and the support member, at least a portion of the display being visible through the front plate;
a first adhesive member located between the front plate and the support member to be adjacent to a periphery of the front plate; and
a second adhesive member located between the rear plate and the support member to be adjacent to a periphery of the rear plate,
wherein the support member includes:
a first surface coupled to the side member;
a second surface on which the display is disposed and which is separated from the first surface with a third surface interposed therebetween, the third surface having the first adhesive member disposed thereon; and
a fourth surface located opposite to the second surface and separated from the first surface with the second adhesive member interposed therebetween,
wherein the support member includes a portion extending to a space between the front plate and the side member to define a portion of a side surface of the electronic device,
wherein an outer surface of the electronic device includes a first boundary portion between the front plate and the support member, a second boundary portion between the rear plate and the side member, and a third boundary portion between the side member and the support member, and
wherein the internal space of the electronic device includes a first space between the front plate and the second surface, a second space between the rear plate and the fourth surface, and a third space separated from the first space and the second space and the second space and extending from the second boundary portion to the third boundary portion via a space between the first surface and the side member.

18. The electronic device of claim 17, wherein the side member further comprises:
- a first non-conductive structure detachably coupled to the first surface and configured in an annular shape along the first surface; and
- a first conductive structure disposed on the first non-conductive structure and defining at least a portion of the side surface of the electronic device, and wherein the support member further comprises:
- a second non-conductive structure defining at least a portion of the first surface; and
- a second conductive structure coupled with the second non-conductive structure.

19. The electronic device of claim 18, further comprising:
a wireless communication circuit configured to transmit and/or receive a signal in a selected or predetermined frequency band via at least a portion of the first conductive structure.

20. The electronic device of claim 18, wherein the first conductive structure further comprises a plurality of extensions extending towards the first surface and mechanically and electrically connected to the second conductive structure.

21. The electronic device of claim 20, wherein the plurality of extensions are mechanically and electrically connected to the second conductive structure using a conductive adhesive material.

* * * * *